United States Patent
Empedocles et al.

(10) Patent No.: US 7,151,209 B2
(45) Date of Patent: Dec. 19, 2006

(54) METHODS OF MAKING, POSITIONING AND ORIENTING NANOSTRUCTURES, NANOSTRUCTURE ARRAYS AND NANOSTRUCTURE DEVICES

(75) Inventors: Stephen Empedocles, Menlo Park, CA (US); Larry Bock, Olivenhain, CA (US); Calvin Y. H. Chow, Portola Valley, CA (US); Xianfeng Duan, Mountain View, CA (US); Chunming Niu, Palo Alto, CA (US); George Pontis, Redwood City, CA (US); Vijendra Sahi, Menlo Park, CA (US); Linda T. Romano, Sunnyvale, CA (US); David Stumbo, Belmont, CA (US)

(73) Assignee: Nanosys, Inc., Palo Alto, CA (US)

( * ) Notice: Subject to any disclaimer, the term of this patent is extended or adjusted under 35 U.S.C. 154(b) by 0 days.

(21) Appl. No.: 11/142,563

(22) Filed: May 31, 2005

(65) Prior Publication Data

US 2005/0230356 A1 Oct. 20, 2005

Related U.S. Application Data

(63) Continuation of application No. 10/405,992, filed on Apr. 1, 2003, now Pat. No. 6,962,823, which is a continuation-in-part of application No. 10/239,000, filed on Sep. 10, 2002, now Pat. No. 6,872,645.

(60) Provisional application No. 60/370,113, filed on Apr. 2, 2002.

(51) Int. Cl.
*H01L 21/302* (2006.01)

(52) U.S. Cl. .................... 977/856; 438/689

(58) Field of Classification Search ............. 977/840, 977/855, 856, 888; 438/689
See application file for complete search history.

(56) References Cited

U.S. PATENT DOCUMENTS

| | | | |
|---|---|---|---|
| 5,196,396 A | 3/1993 | Lieber et al. | |
| 5,252,835 A | 10/1993 | Lieber et al. | |
| 5,274,602 A | 12/1993 | Glenn et al. | |
| 5,332,910 A | 7/1994 | Haraguchi et al. | |
| 5,338,430 A | 8/1994 | Parsonage et al. | |
| 5,505,928 A | 4/1996 | Alivisatos et al. | |
| 5,512,131 A | 4/1996 | Kumar et al. | |
| 5,640,343 A | 6/1997 | Gallagher et al. | |
| 5,674,592 A | 10/1997 | Clark et al. | |
| 5,690,807 A | 11/1997 | Clark, Jr. et al. | |
| 5,751,018 A | 5/1998 | Alivisatos et al. | |
| 5,840,435 A | 11/1998 | Lieber et al. | |
| 5,897,945 A | 4/1999 | Lieber et al. | |
| 5,990,479 A | 11/1999 | Weiss et al. | |
| 5,997,832 A | 12/1999 | Lieber et al. | |
| 6,004,444 A | 12/1999 | Aksay et al. | |
| 6,036,774 A | 3/2000 | Lieber et al. | |
| 6,048,616 A | 4/2000 | Gallagher et al. | |

(Continued)

FOREIGN PATENT DOCUMENTS

WO  WO-9629629  9/1996

(Continued)

OTHER PUBLICATIONS

Bachtold et al., "Logic Circuits with Carbon Nanotube Transistors" (2001) *Science* 294:1317.

(Continued)

*Primary Examiner*—Scott B. Geyer
(74) *Attorney, Agent, or Firm*—Andrew L. Filler

(57) ABSTRACT

Nanostructure manufacturing methods and methods for assembling nanostructures into functional elements such as junctions, arrays and devices are provided. Systems for practicing the methods are also provided.

15 Claims, 8 Drawing Sheets

U.S. PATENT DOCUMENTS

| | | | |
|---|---|---|---|
| 6,068,800 | A | 5/2000 | Shingh et al. |
| 6,128,214 | A | 10/2000 | Kuekes et al. |
| 6,136,156 | A | 10/2000 | El-Shall et al. |
| 6,146,227 | A | 11/2000 | Mancevski |
| 6,159,742 | A | 12/2000 | Lieber et al. |
| 6,190,634 | B1 | 2/2001 | Lieber et al. |
| 6,207,229 | B1 | 3/2001 | Bawendi et al. |
| 6,225,198 | B1 | 5/2001 | Alivisatos et al. |
| 6,248,674 | B1 | 6/2001 | Kamins et al. |
| 6,261,469 | B1 | 7/2001 | Zakhidov et al. |
| 6,294,450 | B1 | 9/2001 | Chen et al. |
| 6,297,592 | B1 | 10/2001 | Goren et al. |
| 6,306,736 | B1 | 10/2001 | Alivisatos et al. |
| 6,322,901 | B1 | 11/2001 | Bawendi et al. |
| 6,361,861 | B1 | 3/2002 | Gao et al. |
| 6,413,489 | B1 | 7/2002 | Ying et al. |
| 6,471,761 | B1 | 10/2002 | Fan et al. |
| 6,858,455 | B1 | 2/2005 | Guillom et al. |
| 2001/0023986 | A1 | 9/2001 | Mancevski |
| 2002/0014667 | A1 | 2/2002 | Shin et al. |
| 2002/0106314 | A1* | 8/2002 | Pelrine et al. ............... 422/186 |
| 2002/0125192 | A1 | 9/2002 | Lopez et al. |
| 2002/0130311 | A1 | 9/2002 | Lieber et al. |
| 2002/0158342 | A1 | 10/2002 | Tuominen et al. |
| 2003/0044777 | A1 | 3/2003 | Beattie |
| 2003/0071246 | A1 | 4/2003 | Grigorov |
| 2004/0026684 | A1 | 2/2004 | Empedocles |

FOREIGN PATENT DOCUMENTS

| | | | |
|---|---|---|---|
| WO | WO 00/63115 | * | 10/2000 |
| WO | WO-0103208 | | 1/2001 |
| WO | WO-02017362 | | 2/2002 |
| WO | WO-02048701 | | 6/2002 |
| WO | WO-02080280 | | 10/2002 |

OTHER PUBLICATIONS

Bjork et al., "One-dimensional Steeplechase for Electron Realized" (2002)*Nano Letters* 2:86-90.

Cao et al., "Growth and properties of semiconductor core/shell nanocrystals with InAs cores" (2000) *J. Am. Chem. Soc.* 122:9692-9702.

Chen et al., "Observation of a Large On-Off Ration and negative Differential Resistance in an Electronic Molecular Switch" (1999) *Science* 286:1550.

Chung et al., "Si Nanowire Devices" (2000) *App. Phys. Letts.* 76(15):2068-2070.

Collier et al., "Electronically Configurable Molecular-Based Logic Gates" (1999) *Science* 285:391-394.

Cui et al., "Doping and electrical transport in silicon wires" (2000) *J. Phys. Chem. B.* 104:5213-5216.

Cui et al., "Functional Nanoscale electronic devices assembled using silicon nanowire building blocks" (2001) *Science* 291:851-853.

Cui et al., "Diameter-controlled synthesis of single-crystal silicon nanowires" (2001) *Appl. Phys. Letts* 78(15):2214-2216.

Dabbousi et al., "(CdSe)ZnS core-shell quantum dots: Synthesis and characterization of a size series of highly luminescent nanocrystallites" (1997) *J. Phys. Chem. B.* 101:9463-9475.

Derycke et al., "Carbon Nanotube Inter-and Intramolecular Logic Gates" (Aug. 2001) *Nano Letters* (online).

Duan et al., "General synthesis of compound semiconductor nanowires" (2000) *Adv. Mater.* 12:298-302.

Gudiksen et al., "Diameter-selective synthesis of semiconductor nanowires" (2000) *J. Am. Chem. Soc.* 122:8801-8802.

Gudiksen et al., "Synthetic control of the diameter and length of single crystal semiconductor nanowires" (2001) *J. Phys. Chem. B.* 105:4062-4064.

Gudiksen et al., "Growth of nanowire superlattice structures of nanoscale photonics and electronics" (2002) *Nature* 415:617-620.

Haraguchi et al., "Polarization Dependence of Ligh Emitted from GaAs p-n junctions in quantum wire crystals" (1994) *J. Appl. Phys.* 75(8):4220-4225.

Haraguchi et al., "Self Organized Fabrication of Planar GaAs Nanowhisker Arrays" (1996) *Appl. Phys. Lett.* 69(3):386-387.

Hiruma et al., "GaAs Free Standing Quantum Sized Wires" (1993) *J. Appl. Phys.* 74(5):3162-3171.

Huang et al., "Logic Gates and Computation from Assembled Nanowire Building Blocks" (2001) *Science* 294:1313.

Huang et al., "Directed Assembly of One-Dimensional Nanostructures into Functional networks" (2001) *Science* 291:630-633.

Jun et al., "Controlled synthesis of multi-armed CdS nanorod architectures using monosurfactant system" (2001) *J. Am. Chem. Soc.* 123:5150-5151.

Kong et al., "Synthesis of individual single-walled carbon nanotubes on patterned silicon wafers" (1998) *Nature* 395:878-881.

Kong et al., "Chemical vapor deposition of methane for single-walled carbon nanotubes" (1998) *Chem. Phys. Lett.* 292:567-574.

Kong et al., "Nanotube molecular wires as chemical sensors" (2000) *Science* 287:622-625.

Liu et al., "Sol-Gel Synthesis of Free-Standing Ferroelectric Lead Zirconate Titanate Nanoparticles" (2001) *J. Am. Chem. Soc.* 123:4344.

Manalis et al., "Microvolume field-effect pH sensor for the scanning probe microscope" (2000) *Applied Phys. Lett.* 76:1072-1074.

Manna et al., "Synthesis of soluble and processable rod-, arrow-, teardrop-, and tetrapod-shaped CdSe nanocrystals" *J. Am. Chem. Soc.* (2000) 122:12700-12706.

Manna et al., "Epitaxial growth and photochemical annealing of graded Cds/ZnS shells on colloidal CdSe nanorods" (2002) *J. Am. Chem. Soc.* 124:7136-7145.

Morales et al., "A lawer ablation method for the synthesis of crystalling semiconductor nanowires" (1998) *Science* 279:208-211.

Peng et al., "Epitaxial growth of highly luminescent CdSe/CdS core/shell nanocrystals with photostability and electronic accessibility" (1997) *J. Am. Chem. Soc.* 119:7019-7029.

Peng et al., "Shape control of CdSe nanocrystals" (2000) *Nature* 404:49-61.

Puntes et al., "Colloidal nanocrystal shape and sixe control: The case of cobalt" (2001) *Science* 291:2115-2117.

Schon et al., "Field-effect modulation of the conductance of single molecules" (2001) *Science* 294:2138.

Schon et al., "Self-assembled monolayer organic field-effect transistors" (2001) *Nature* 413:713.

Service, "Assembling nanocircuits from the bottom up" (2001) *Science* 293:782.

Thess et al., "Crystalline ropes of metallic carbon nanotubes" (1993) *Science* 273:483-486.

Tseng et al., "Toward nanocomputers" (2001) *Science* 294:1293.

Urban et al., "Synthesis of single-crystalline perovskite nanowires composed of brium titanate and strontium titanate" (2002) *J. Am. Chem. Soc.* 124:1186.

Wu et al., "Block-by-block growth of single-crystalline Si/SiGe superlattice nanowires" (2002) *Nano letters* 2:83-86.

Yazawa "Semiconductor nanowhiskers" (1993) *Adv. Mater.* 5(78):577-579.

Yun et al., "Ferroelectric properties of individual barium titanate nanowires investigated by scanned probe microscopy" (2002) *Nano letters* 2:447.

Zhou et al., "Nanoscale metal/self-assembled monolayer/metal heterostructures" (1997) *Applied Phys. Lett* 71:611.

* cited by examiner

METHODS OF MAKING, POSITIONING AND ORIENTING NANOSTRUCTURES, NANOSTRUCTURE ARRAYS AND NANOSTRUCTURE DEVICES

CROSS-REFERENCE TO RELATED APPLICATIONS

This application is a continuation of U.S. Ser. No. 10/405,992, filed Apr. 1, 2003 now U.S. Pat. No. 6,962,823, which is a continuation-in-part of U.S. Ser. No. 10/239,000, filed Sep. 10, 2002 now U.S. Pat. No. 6,872,645, which claims the benefit of U.S. Ser. No. 60/370,113, filed Apr. 2, 2002. The present application claims priority to and benefit of each of these prior applications, which are hereby incorporated herein by reference in their entirety for all purposes.

FIELD OF THE INVENTION

This invention is in the field of nanostructure (e.g., nanowire, nanotube, nanorod, nanoribbon, quantum dot, nanodot, nanotetrapods, etc.) manufacture and assembly.

BACKGROUND OF THE INVENTION

In general, a hierarchy of nanostructure building block to nanostructure device exists. The basic building block of a device is the nanostructure itself, e.g., a nanowire, nanotube, nanorod, nanoribbon, quantum dot, nanodot, nanotetrapod, or the like. These structures can be semiconductors (e.g., doped semiconductors). When two such nanostructures interact at a junction, they provide the basic elements of an electrical circuit, e.g., by providing pn, pnp, npn, or pip junctions. An interface can exist between a conductor (which is generally coupled to a power source) and the nanostructure, e.g., a pinout. Arrangements of junctions and interfaces provide for the formation of bipolar or field effect transistors (e.g., npn or pnp transistors), rectifiers, diodes, gates, amplifiers and the like. These elements form the basic elements of a circuit, which, in turn, provide the basic element of essentially all electrical devices.

A variety of methods of making one-dimensional structures for use in small scale devices and device elements and methods of making junctions and circuits of such devices have been described. For example, nanostructures such as nanowires and nanotubes transport electrons and excitons, providing building blocks for nanoscale devices. Studies of charge carrying properties of such elements have led to the creation of field effect transistors, single electron transistors, rectifying junctions, and even complete circuits.

While a variety of ways of making nanostructures are available, current technologies are largely insufficient to form high yields of nanostructures, particularly of nanostructures having pre-selected properties (e.g., uniformity). In addition, existing methods of assembling nanostructures into junctions, arrays and functional devices are fairly cumbersome. The following disclosure provides a number of nanostructure manufacturing methods that greatly increase the yield of desired nanostructures, as well methods for assembling nanostructures into functional elements, such as junctions, arrays, devices and/or the like. Systems for practicing the methods and devices and arrays made by the methods are also a feature of the invention.

SUMMARY OF THE INVENTION

The present invention provides a variety of methods for making nanostructures, nanostructure arrays and nanostructure devices, as well as the nanostructures, nanostructure arrays and nanostructure devices themselves. Corresponding systems which are useful for practicing the methods or that use the arrays or devices of the invention are also provided. The various methods for making nanostructure arrays can utilize nanostructures made by the methods herein, as well as nanostructures made by other methods. Nanostructures of interest include, but are not limited to, nanowires, nanodots, nanotubes, nanorods, nanotetrapods, quantum dots and/or the like.

In a first aspect, methods of forming nanowires or other nanostructures are provided. In the methods, a nanostructure (e.g., a nanowire) catalyst (e.g., gold, iron or the like) is patterned on a substrate in a plurality of patterned elements (e.g., disks or other shapes). A volume of the patterned elements has a sphere diameter less than the diameter of a selected nanostructure. The nanostructure catalysts are heated to form nanostructure catalyst spheres. In certain embodiments, it may be desirable to heat the nanostructure catalyst in the presence of the nanostructure precursor to lower the melting point of the catalyst to form the catalyst spheres. It can also be desirable to deposit the catalyst as a eutectic alloy. In any case, by controlling the size of each patterned element, the volume of each patterned element, the nature of the substrate material, the rate of heating and the final temperature, the catalysts can be made to aggregate into single droplets, e.g., of a pre-selected size. Across all of the patterned elements, the size of the single droplets may be uniform or non uniform and can display a Gaussian or non-Gaussian (e.g., bimodal, trimodal, etc.) size distribution. The aggregation characteristics can be pre-selected based upon theoretical calculations considering the substrate and droplet properties, or can be based on empirical observation, or both, and can be controlled by controlling the thickness or surface dimensions of the patterned elements. Nanostructure precursors (e.g., comprising silicon) are added to form precursor/catalyst spheres, and nanostructures such as nanowires are formed from the nanostructure precursors. The precursor/catalyst spheres have a diameter which determines the diameter of the final nanostructure. The resulting array of nanostructures can be a regularly or irregularly ordered spatial array of structures, with the specific arrangement related directly to the arrangement of the patterned elements on the substrate. In some embodiments, the shape of a patterned element and the nature of the substrate can be selected to cause the catalyst sphere to form in substantially the center of the patterned element. In this case, it will be understood by one of skill in the art that by "center" we mean roughly the center, and that the exact location will be dependent on a combination of factors, including the wetting properties of the catalyst/precursor sphere and the substrate, and symmetry and overall shape of the catalyst pad. In some cases, it will only be possible to determine the exact location of the resulting catalyst sphere through empirical observation, however, after the location has been identified, it will generally be substantially the same for all subsequent catalyst/precursor sphere-substrate combinations. In all cases, the methods of the present invention will result in catalyst/precursor spheres that are located substantially within the area of the patterned element from which it is formed. This provides a novel method for precisely locating individual catalyst/precursor spheres. In another embodiment, the nanostructure is located in a region that is not substantially in the center of the area of the substrate initially covered by the patterned element, corresponding to the location of a predetermine position selected on the substrate (e.g., defined by a pit).

In the above method, as with the other methods herein, it will be appreciated that the order of the steps can vary with the application. For example, the heating step can be performed before or after the adding step—that is, it is understood that the sphere optionally will be formed until after the precursors are added, e.g., where the presence of the precursor lowers the melting point causing the metal to melt and form the sphere.

It will be recognized by one of skill in the art that a "catalyst sphere" is not necessarily spherical in shape. A catalyst sphere refers to a single liquid drop of material comprising one or more nanostructure catalyst materials and one or more nanostructure precursors, where the shape of the drop is governed by the wetting properties of the liquid on the substrate, and/or the contact angle of the liquid on the substrate.

The nanostructures themselves can include heterostructures or homostructures, which can be substantially uniform in diameter or substantially nonuniform in diameter. Arrays of nanostructures resulting from the method are also a feature of the invention. Similarly, an array of nanostructures comprising an arbitrary pattern of a plurality of nanostructures, each comprising a selected diameter, are a feature of the invention. In this feature of the invention, the individual characteristics of the nanostructures within the array are controlled, in part, by the individual features of the patterned elements from which they are formed. By creating an array of patterned elements with different sphere volumes, different materials and/or different shapes, it is possible to form a predefined array of nanostructures with preselected characteristics of location, diameter and composition. It is also possible to form drops with a substantially geometric shape (e.g. square, hexagon, etc) through either the intrinsic crystal structure of the substrate, or active patterning of the substrate prior to metal deposition.

The nanostructures of the present invention optionally interact to form functional or operational elements such as LEDs, lasers, biosensors, logic circuits, memory, and/or the like.

In light of the present invention, it will be apparent to one of skill in the art that one can create a patterned array of nanostructure catalysts with an almost unlimited set of parameters. These parameters can include the size and shape of each individual patterned element, the thickness of each individual patterned element, the material from which each individual patterned element is formed (e.g. including but not limited to gold, iron, cobalt, manganese, alloys, etc.). It is even possible, using standard lithographic processes, to create arrays of multiple different patterned materials, each from a different material. Each of these different patterned elements can be fabricated simultaneously or sequentially. It is possible to grow nanostructures from one array of patterned elements and then add additional patterned elements to the substrate to grow a second set of nanostructures. In this case, the nanostructures of the first and second set can be made from either the same or different nanostructure precursors. It is also possible to remove any remaining catalyst/precursor spheres created in the first step prior to depositing the second set of patterned elements. This provides precise control over the material characteristics of the final nanostructure array.

As used in this application, the term radius is the same as the effective radius, defined as the average of the major and minor axes of the cross-section of the sphere at the interface with the substrate or nanostructure. A similar definition for sphere diameter (e.g. effective diameter) will be understood by one of skill in the art.

In one aspect of the present invention, it is possible to create patterned elements with a surface area across the substrate that is much larger than the diameter of the resulting catalyst/precursor sphere. In this case, the thickness of the patterned element will be substantially smaller than the lateral dimensions of the element across the substrate. Using this characteristic of the present invention, it is possible to use lithographic processes with a resolution far larger than the defined diameter of the resulting nanostructures to create the array of patterned elements. For instance, a 50 nm diameter nanowire can be formed from a circular patterned element with a diameter of 300 nm and a thickness of 7.4 nm. Note that these numbers are intended to emphasize a point, and that they do not necessarily represent the real numbers for an actual set of materials. In fact, it will be appreciated by one of skill in the art that the diameter of the resulting catalyst/precursor sphere will be modified by the additional volume resulting from the addition of the nanostructure precursor to the sphere.

In another aspect of the invention, methods of growing a nanostructure such as a nanowire in a selected direction or orientation are provided. In the methods, a magnetic field is applied to a eutectic interface between a nanostructure crystal and a catalyst mixture comprising a magnetic colloid (e.g., iron) and a nanostructure precursor. Note that the catalyst mixture may optionally comprise additional non-metallic catalyst materials. This results in control over the direction or and diameter of nanostructure growth. By applying a force that interacts with the catalyst colloid (e.g. a magnetic field), the direction of the interface between the liquid and solid can be modified and the direction of subsequent growth affected. The nanostructure will tend to grow in a direction normal to the resulting interface. Alternatively, if the force is directed normal to the existing interface, the result will be a deformation of the catalyst colloid, increasing or decreasing the effective diameter of the resulting sphere and therefore the resulting nanostructure. In this way, the methods of the present invention can be used to intentionally modify the diameter of the nanostructure during the growth process. Note that even forces that are directed non-normal to the existing interface can optionally change the effective diameter of the sphere.

The magnetic field can be, e.g., an electromagnetic grid, a grid of electro-magnets, a magnetic grid, or the like and the intensity or direction of the magnetic field can be altered during growth of the nanostructure. Resulting nanostructures can be homostructures or heterostructures. In an alternative embodiment, the magnetic field can be applied only at the beginning of the nanostructure growth process to influence the overall direction of the growth of a substantially straight nanostructure such as a substantially straight nanowire. This could be used to cause a catalyst colloid formed or placed at one electrode to grow a nanostructure substantially in the direction of a second electrode, even if no change in direction was applied after the growth process was started (i.e. after the first monolayer of the nanostructure was formed.

Corresponding systems are also a feature of the invention, e.g., a system comprising a nanowire crystal, a catalyst mixture comprising a magnetic colloid proximal to or in contact with the crystal, an electrical, magnetic, or electromagnetic field generator and a controller which directs orientation or intensity of a magnetic field produced by the magnetic field generator. The system optionally comprises a user interface which permits a user to direct the controller to direct the orientation or intensity of the magnetic field.

In another aspect, the invention includes methods of making non-static (assemble-able and disassemble-able) arrays of nanostructures, such as nanowires, via fluidic control methods. In the methods, at least a first set of nanostructures is flowed into position to form a first array of nanostructures. Optionally, more than one type of nanostructure can comprise the set, e.g., a first type of nanostructure can be flowed from a first source and a second type of nanostructure can be flowed from a second source to provide the first set of nanostructures. Alternatively, first and second types of nanostructures can be flowed from a single mixed source. Thus, nanostructure members of the first array can be the same or different (e.g., differ by size, composition, attachment of chemical or biological moieties, etc.) and can include homostructures or heterostructures. The nanostructures of the first array are reversibly immobilized in position. The first array can be a spatially ordered array, an individually addressable array, or a random array and members of the array can be in electrical contact with one another, or with external elements such as electrodes. The first array of nanostructures is disassembled or moved by unimmobilizing the first set of nanostructures or the first array, or both. At least a second set of nanostructures is flowed into position to form a second array of nanostructures, which optionally includes any of the features noted for the first array. The nanostructures of the second array are immobilized in position, and this immobilization can be either reversible or irreversible. For both the first and second array, reversible immobilization can include one or more of: binding the nanostructures to a substrate via one or more reversible chemical bonds, applying fluidic pressure to the nanostructures, applying an electric field to the nanostructures, and/or applying a magnetic field to the nanostructures, using biological binding elements, covalent bonds or ionic bonds, and using electrostatic forces. The reversible immobilization optionally comprises individually locating and positioning ("individually addressing") at least one of the nanostructures.

While, in a preferred embodiment, the nanostructures are flowed into position within the arrays of nanostructures, it is not required that a flow be involved. In an alternative embodiment, nanostructures such as nanowires in solution are placed over the final location of the array and are transported to their final location by passive diffusion or active means such as electric or magnetic fields. This solution can be placed over the array location in a static drop, or the location of the final array can be immersed in the solution. It will be understood that any of the methods described here that do not explicitly require the force of fluidic movement for placement or alignment, can be repeated in a non-flow-based process using the methods of the present invention.

Assays can be performed using the first or second array, or both. The same assay can be performed using the first array as using the second array, or different assays can be performed. It will be appreciated that one benefit of the non-static nature of the arrays is that assays that permanently alter an array (e.g., chemically modify or degrade the array) can desirably be performed using the non-static arrays, given that the arrays can be used once and then disassembled (that is, the arrays are optionally "single-use" arrays). An assay result detected using the array can include detecting a detectable signal such as an assay product mass, an assay product optical emission, an assay product electrical emission, a change in conductivity of the nanostructure array, an assay product magnetic field, and an assay product binding event, or the like. In one class of embodiments, therefore, the methods include flowing an electric current into or through the first or second array.

In alternative embodiments, all of the assays and assay processes described herein, the detectable signal, understood to relate to the overall concentration of the specific analyte of interest in the sample solution, can also be generated by a secondary product of the assay product. For instance, an assay for mRNA can be performed by measuring the detectable signal from a tRNA or DNA transcribed or reverse transcribed from the mRNA and still fall within the scope of the present invention. Similarly, a protein fragment generated from a protein analyte can be used to quantify the presence of the original protein. In still another embodiment, the detectable product may be an indirect product of the analyte. For instance, by secondarily labeling an immobilized analyte with an enzyme, assay results can be determined by detecting any of changes described above for the enzyme product. Finally, binding elements such as aptazymes can be used that change configuration upon interaction with a specific analyte. The presence of the analyte then results in a change in the aptazyme, which, in turn, can be detected by the changes described above. Overall, it will be understood that any assay that produces a quantitative or qualitative amount of a product in response to the presence of an analyte of interest can be detected using the methods described here. Such products are referred to as assay secondary products.

Corresponding systems for making arrays of nanostructures (e.g., nanowires) via fluidic assembly are also a feature of the invention. For example, the system can include a first source (well, chamber, microtiter tray, or the like) comprising at least a first suspension of nanostructures and a fluid conduit coupling the first suspension of nanostructures to a nanostructure array construction region. There can, of course, be additional fluid sources and fluid conduit networks coupling the suspensions to the array assembly region. Indeed, the system can be configured with multiple array assembly regions, multiple sources of nanostructures and fluidic conduit networks that couple the sources to the array assembly regions for the parallel assembly and disassembly of arrays. The array construction region(s) is/are configured to reversibly detain nanostructures from the first suspension such that the nanostructures in the suspensions are connected into an operable nanostructure array (or arrays). The system optionally includes a controller which regulates reversible detention of the nanostructures in the nanostructure array construction region(s). The system optionally includes a signal detector configured to be operably coupled to the array construction region(s) or to one or more nanostructure array(s) in the region(s). The signal detector detects, e.g., a mass signal, an optical signal, an electrical signal, a magnetic signal, a force signal, or a combination thereof, e.g., to detect an assay result or condition of the array. The signal detector can detect a signal from a single nanostructure (e.g., from a nanowire), or from multiple nanostructures simultaneously. These multiple nanostructures can be measured as a single measurement, or individually addressable, or some combination of the two. The system optionally includes a digital to analog or analog to digital converter (and A/D or D/A converter) which converts an analog signal from the signal detector into digital data. The system optionally includes a data storage module operably coupled to the signal detector, which stores signal data from the signal detector.

In a related aspect, the invention provides methods of performing an assay. In the methods, at least a first set of nanostructures such as nanowires is flowed into position to form a first array of nanostructures such as nanowires and an assay is performed. The assay produces an assay result that is detectable by the first array and the assay result is detected. It will be appreciated that this aspect does not require non-static arrays, i.e., the array assembled by this method can be permanent or temporary. All of the various issues noted for arrays made via fluidic assembly methods apply equally to this embodiment. Whether the methods use temporary or permanent arrays, the assays that can be performed include detecting presence, concentration or relative concentration of a chemical or biological molecule, genotyping a sample, detecting a SNP, detecting an antigen, detecting an antibody, detecting a nucleic acid, detecting a protein, detecting a hazardous material, detecting a chemical or biological warfare agent, or the like.

This embodiment can be used to assemble an array of nanostructures immediately prior to running an assay, but can also be used to create a specific nanostructure array for an assay to be run in the future. The system comprising the as-assembled array can be packaged and shipped prior to running the assay.

In one embodiment, the present invention describes a method of manufacturing a nanostructure array for use in a bioassay in which nanostructures such as nanowires with a specific assay binding element on their surface are flowed into position within an array and immobilized. This array is then later used to perform a bioassay. In this embodiment, the nanostructures (e.g., nanowires) can all be the same or different and the binding elements on the surface of each wire can either be the same or different within or between wires. Optionally, it is possible to assemble the wires into an array and then attach the binding elements to the surface of all the wires or selectively to only some of the wires. This second alternative can be done by taking advantage of compositional differences such as different chemically active groups on the surface of different nanostructures that are then used to bind to binding elements with specific complementary active groups. In this embodiment, at least one of the nanostructures is preferably in electrical contact with an electrode. In some embodiments, some of the nanostructures/nanowires are optionally individually addressable, and assay results from each assay type are determined by measuring a signal from a nanostructure with a binding element for that assay.

In another aspect, the present invention includes methods of harvesting nanostructures. In the methods, an etchable portion of the nanostructure or an etchable material (e.g., silicon oxide) in contact with the nanostructure is etched away to release the nanostructure from the etchable portion or etchable material. Here again, the nanostructures can include heterostructure nanostructures, homostructure nanostructures, nanowires, nanotubes, nanorods, nanotetrapods, nanodots, nanoribbons quantum dots, or the like. The etchable material can be an etchable substrate. The substrate can comprise e.g., a layer of etchable material over a layer of a non-etchable material, or the etchable substrate can be etchable throughout. The etchable material can include an etchable attachment site to a substrate, or, e.g., an etchable region of the nanostructure that is differentially etchable from a non-etchable region of the nanostructure. Optionally, the method includes etching a set of etchable portions, thereby releasing a set of nanostructures or, etching a set of etchable materials in contact with a set of nanostructures, thereby releasing the set of nanostructures. One or more etchant can be used to release the nanostructures, e.g., a dry etchant, a wet-etchant, an isotropic etchant, an anisotrpic etchant a selective etchant, or the like.

In an alternative embodiment, an etchable region of a nanostructure can be located near the end of the nanostructure, before the catalyst colloid. In this case, etching can be used to cleanly remove the catalyst colloid from the nanostructure. Alternatively, etchable regions can be located at both ends to cleanly release the nanostructure from both the substrate and the catalyst colloid. In a particularly preferred embodiment, harvesting of nanostructures by the methods described here results in a substantially faceted end of the nanostructure where the etchable region was removed. This is in contrast to standard methods for harvesting nanostructures such as nanowires using sonication or the like, which result in a broken end. In an additional alternative embodiment, two or more etchable regions of a nanostructure can be located at predefined distances from each other along the length of the nanostructure, so that, upon etching, the resulting nanostructure fragments are of a predefined length. If more than two etchable regions are included in each nanostructure, the spacing between the regions can be the same or different, and can be predefined or random to produce a plurality of different resulting nanostructure lengths.

Corresponding systems are also a feature of the invention, e.g., a system comprising at least one etchant, and at least one nanostructure comprising an etchable portion, or comprising one or more nanostructure coupled to an etchable material. The system can also include, e.g., an etchant controller which controls placement of the etchant onto the etchable portion or material, or which controls a duration of contact between the etchant and the etchable portion or material. The etchant controller optionally receives feedback from the system regarding the degree of etching achieved by the etchant and can control further contact of the etchant and the etchable portion or material in response to the feedback. The system optionally includes one or more etchant dispensing modules which dispense the etchant into contact with the etchable portion or material. The etchant dispensing modules optionally include one or more etchant flow channels or chambers which contain or direct flow of the etchant. As an example, not intended to restrict the scope of the invention, feedback could involve direct measurement of the etchable material in the solution surrounding the nanostructure. The progress of etching can be measured by the rate of increase of concentration as a function of etching time, and the concentration of etchant can be adjusted to control the rate.

In an additional class of embodiments, methods of making one or more controlled length nanostructures, are provided. The methods include depositing at least one nanostructure catalyst on a substrate and growing a nanostructure from the catalyst in a nanostructure growth process that comprises adding a first and a second material at different times during growth of the nanostructure, thereby controllably incorporating the first or second material, or both, into the nanostructure during the growth process. The resulting nanostructure is exposed to an etchant that differentially etches regions of the nanostructure made from the first or second material, thereby controllably cleaving the nanostructure into one or more controlled length nanostructures. In one example embodiment, the first or second material can comprise a dopant (e.g., the second material can be the first material plus a dopant). Thus, in this embodiment, the method would include depositing at least one nanostructure catalyst on a substrate, growing a nanostructure from the catalyst in a nanostructure growth process that comprises periodically introducing one or more dopant during growth of the nanostructure, thereby controllably incorporating the dopant into the nanostructure during the growth process, and, exposing the resulting doped nanostructure to an etchant that differentially etches doped or non-doped regions of the doped nanostructure, thereby controllably cleaving the nanostructure into one or more controlled length nanostructures.

Populations of controlled length nanostructures made by these methods are also a feature of the invention. In an alternative embodiment, rather than periodically introducing a dopant, the process comprises periodically introducing a second material composition entirely, resulting in an alternating heterostructure of two materials, one of which is selected to be selectively etchable relative to the other.

The substrate can include, e.g., a semiconducting crystalline material, a polymer, an amorphous surface, silicon, glass, quartz, alumina, gallium arsenide, or the like. The nanostructure catalyst is optionally deposited lithographically, or, optionally, via controlled vapor deposition. The nanostructure catalyst is typically deposited as a colloid that includes gold or another suitable catalyst (iron, silver, cobalt, etc) material. The nanostructure precursor or the dopant can comprise, e.g., a group II, group III, group IV, group V, or group VI compound. For example, the nanostructure precursor can comprise silicon, while the dopant comprises B, P, As, Ge, Ga, In, or Al. The etchant can include a dry etchant, a wet-etchant, an isotropic etchant, an anisotrpic etchant, a selective etchant, or the like. An example etchant comprises $NH_3OH$. The etchant selectively cleaves regions of the nanostructure comprising the dopant, or regions of the nanostructure that do not comprise the dopant, depending on the application. The nanostructure is cleaved such that the ends of the nanostructure comprise one or more dopant. The cleaved ends optionally provide one or more conductive or semiconductive contact region for the nanostructure (which can be, e.g., a nanowire, a nanotube, a nanorod, a nanodot, or the like).

Related systems for making controlled length nanostructures are also a feature of the invention. For example, a system that includes a substrate, a source of a nanostructure catalyst, system instructions for transporting the catalyst to the substrate and for depositing the nanostructure catalyst on the substrate, and a source of a nanostructure precursor are provided. Typically, the system also includes a source of a dopant material, system instructions for transporting the nanostructure precursors from the nanostructure precursor source to the substrate and into contact with deposited nanostructure catalyst, under conditions suitable for nanostructure growth, and system instructions for periodically introducing dopant from the dopant source to the substrate during growth of the nanostructure, thereby providing for controlled introduction of the dopant during growth of the nanostructure. Optionally, the system can include a source of etchant that differentially etches doped or non-doped regions of the nanostructure, and instructions for introducing the etchant into contact with the nanostructure, thereby controllably cleaving the nanostructure into controlled length nanostructures.

The substrate, nanostructure precursor, dopant or etchant can be any of those previously noted and the nanostructure made in the system can be any of those previously noted as well. The catalyst source, the nanostructure precursor source, the dopant material source, or the etchant source optionally comprises one or more gaseous or vapor materials containers. The system instructions are typically embodied in a computer or in a computer readable media.

It will be appreciated that this class of embodiments includes populations (including, optionally, arrays) of nanostructures comprising substantially similar lengths and dopant material composition, wherein the dopant material is heterogeneously distributed throughout the nanostructures. Thus, in one aspect, an array of nanostructures is provided, comprising a substrate having a plurality of nanostructures projecting therefrom, wherein the nanostructures have dopant material similarly distributed in a plurality of regions of the nanostructures, wherein the distribution of the dopant material is non-uniform. In an alternate embodiment, embodiment, the material composition of different nanostructures is entirely different, rather than simply differing by dopant type.

In another class of embodiments, methods of making a nanostructure device are provided. In the methods, a substrate is provided. A nanostructure catalyst particle is deposited on the substrate and a nanostructure is grown from the catalyst particle, providing a nanostructure with a catalyst particle at one end of the nanostructure. The end comprising the catalyst particle is then connected to one or more functional (e.g., electrical) contacts. Nanostructure devices made by the methods are also a feature of the invention.

The substrate in this class of embodiments can include any of those noted above, e.g., a semiconducting crystalline material, a polymer, an amorphous surface, silicon, glass, quartz, alumina, gallium arsenide, or the like. The catalyst can be any of those noted herein, e.g., a gold particle.

Depositing the nanostructure catalyst optionally includes etching the substrate, masking the etched substrate, and laying catalyst particles on the area accessible through the mask. The electrical contacts are coupled to each end of the nanostructure by planar processing, e.g., photolithography as in standard integrated circuit manufacturing.

This set of embodiments also includes nanostructure devices. Example devices include a substrate having a nanostructure thereon, wherein the nanostructure is coupled to a particle at least at one end of the nanostructure, wherein the particle is coupled to an electrical contact. The nanostructure device is optionally coupled to an electrical contact at each end of the nanostructure. The nanostructure is optionally oriented in a same plane as the substrate, or, in another desirable class of embodiments, is oriented perpendicular to the substrate. Arrays of such devices are also a feature of the invention.

In another aspect, the invention includes methods of controlling growth of a nanostructure such as a nanowire. The method includes providing an electric field between two electrodes. Nanowire or other nanostructure growth is initiated at one or both of the electrodes by either forming the electrode from an appropriate catalytic material, or by incorporating a catalyst patterned element or colloid on the electrode. A nanostructure is then grown between the electrodes, with the electric field used to affect the direction of growth. In this embodiment, the electric field directs nanostructure formation, e.g., by controlling the direction, orientation, and/or diameter of nanostructure formation. Electric-field directed growth of nanowires and nanotubes is know in the art; however, in the art, the electric field used to direct growth does not originate from the same electrodes that the wire is grown between. The reason is that the electric fields required to influence the growth direction of the nanowires or nanotubes, is so large that the moment the nanowire or nanotube bridges the space between the electrodes, current flowing through the nanostructure causes the structure to heat and break (like a fuse). As such, previous methods of directed growth use two sets of electrodes, one to apply the field, the other to connect with the nanostructure.

In the present invention, the magnitude of the electric field is modulated by a feedback mechanism that prevents a significant current from flowing through nanostructure after it bridges the gap between the electrodes. A change in current between the electrodes upon contact, or a change in capacitance between the electrodes during growth is detected, and the electric field is modified (e.g., reduced or turned off) in response to the nanostructure contact or the change in capacitance. In one simple embodiment, the automatic detection is performed with a circuit comprising a resistor. In another embodiment, the system comprises a current-divider, as is known in the art, such that the relative resistance of a nanostructure is substantially larger than a second conducting path that the amount of current flow across the nanostructure at the voltages used for directed growth do not cause the nanostructure to break.

This process can be performed in parallel with multiple electrodes, e.g., by growing a plurality of additional nanostructures between a plurality of additional electrodes comprising nanostructure catalysts. The electric field or one or more additional electric fields direct additional nanostructure growth between the additional electrodes. Nanostructure contact between the additional electrodes is automatically detected and the electric field or fields is modified in response to the contact. Here again, in one simple embodiment, nanostructure contact between any two electrodes can be detected, e.g., by a series of resistors, e.g., one resistor per nanostructure.

Extended contact by a nanostructure such as a nanowire to both electrodes while a potential difference exists between the electrodes can be undesirable, because the flow of current through the nanowire (or other relevant nanostructure) can burn out the nanowire if the flow is to high. Thus, detection of capacitance can be used to shut the electric field off just prior to or approximately simultaneous with contact of a growing nanowire to a destination electrode. As the nanostructure grows toward the second electrode, the spacing between the electrodes decreases, and the capacitance decreases. This measurement can be calibrated as a direct measure of the remaining distance between the nanostructure and the second electrode. Alternatively, the nanostructure can be grown for a period of time known to bridge enough of the gap between electrodes that the nanostructure will continue to grow in substantially the same direction, contacting the second electrode in the absence of an electric field. That way, the electric field can be turned off in the absence of any direct feedback. Alternately, the nanostructures are grown in the presence of a gate voltage, whereby the nanostructures are rendered non-conducting. As a result, the nanostructures act as insulators and no current flows upon connection with the second electrode.

Systems for practicing this class of embodiments are also a feature of the invention. The systems include a first electrode and a second electrode, where at least one of the electrodes comprises a nanostructure catalyst. The system also includes a nanostructure precursor, a power source coupled to the electrodes, a detector which detects nanostructure contact between the two electrodes or the progress of the growth of the nanostructure from one electrode to the other, and a controller which controls the power source in response to a signal from the detector. The power source can be an AC or DC power source. The detector or controller optionally includes an electrical circuit that includes a resistor. The electrical circuit is coupled to the first electrode, the second electrode, or both the first and second electrodes. In one embodiment, the detector and the controller are provided by a single electrical circuit comprising a resistor. The electrical circuit is coupled to the first electrode, the second electrode, or both the first and second electrodes.

In another aspect, the invention includes methods of making geometrically defined nanostructures. In the methods, a nanostructure template is seeded with a nanostructure catalyst (e.g., a particulate such as a gold or other metallic particulate). Nanostructures are grown from or on the template, wherein the shape, direction, orientation or position of the nanostructures is constrained by the template. Systems for making geometrically defined nanostructures are also a feature of the invention. The systems include, e.g., a template seeded with a nanostructure catalyst and, a nanostructure precursor. The nanostructure template can include wells, pits, trenches, channels or grooves into which the catalyst is seeded. In general, the nanostructure template includes a shaped region (e.g., produced by laser ablation or etching) into which the catalyst is seeded. The shaped regions can be evenly or irregularly spaced. The nanostructures produced by these methods and systems optionally include heterostructure nanostructures or homostructure nanostructures.

The template can be used to define the origination point of a growing nanostructure by localizing the catalyst material (e.g. in a pit). The template can also influence the direction of the growth. For instance, a catalyst placed at the end of a long narrow trench is forced to grow along the trench, unless some force causes it to grow in a direction that takes it outside of the trench. This can be prevented by using a substrate that is substantially amorphous under the growth conditions for the wires. In that case, the wires generally grow isotropically along the surface of the substrate. Alternatively, the wires can be grown in a channel that is closed on all sides, with precursors flowed in from the end. As an example of how this aspect of the invention could be used, but not intending to limit the scope of the invention, a template could be created with a trench extending from one electrode to another. The trench should have an aspect ratio of greater than 10:1, and preferably be less than 1 micron wide. A catalyst placed on one electrode at one end of the trench will begin to grow a nanostructure. The direction of that growth can be influence by an electric or magnetic field, or not be influenced at all. The walls of the trench, acting as barriers to growth in 3 of 4 possible growth directions, causes the wire to grow in a direction substantially toward the second electrode. This channel can be straight or bent, and/or can intersect other channels. In the case of intersecting channels, it is not likely that at least certain nanostructures will change channels due to the rigid, crystalline structure of many nanostructures. Instead, crossed channels can be used to create cross-bar structures between several nanostructures that can be grown either simultaneously or sequentially.

In another aspect, the present invention includes methods of depositing nanostructures such as nanowires on a substrate. In the methods, nanostructures are suspended in solution. The resulting nanostructure suspension is applied to a rotatable substrate which is rotated, thereby depositing the nanostructures on the rotating rotatable substrate. This has the advantage of radially aligning the nanostructures on the rotatable substrate. The nanostructures are optionally applied to the rotatable substrate prior to rotation of the rotatable substrate, or alternately can be applied to the rotatable substrate during rotation of the rotatable substrate.

The nanostructures which are radially aligned can comprise heterostructures or homostructure nanostructures. In this embodiment, the substrate is optionally chemically functionalized to bind to the nanostructures, securing them in position once they contact the surface.

Corresponding systems for radially aligning nanostructures can also be produced. The systems include a rotatable substrate adapted to receive nanostructures, a rotation mechanism which is configured to rotate the rotatable substrate and a suspension of nanostructures. The system also optionally includes a contact module which contacts the suspension of nanostructures to the rotatable substrate.

In another aspect, the invention includes a large scale method of nanostructure (e.g., nanowire) production. The method includes providing a particulate nanostructure catalyst to a fluid or aerosol reactor and growing nanostructures from the particulate catalysts. Corresponding systems are also a feature of the invention, e.g., which include a particulate nanostructure catalyst, a fluid or aerosol reaction chamber and a nanostructure precursor. The nanostructures that are provided include heterostructure nanostructures, homostructure nanostructures and/or the like.

In an additional class of embodiments, methods of making nanostructures are provided. The methods include entrapping a nanostructure catalyst in a flowing gas or plasma stream, contacting the nanostructure catalyst with one or more nanostructure precursors, whereby the nanostructures are formed in the flowing gas or plasma stream, and extracting the nanostructures from the flowing gas or plasma stream.

In this class of embodiments, the nanostructure catalyst is typically a colloid, e.g., a gold colloid solution. The gas typically comprises one or more noble gas, e.g., He or Ar. The nanostructure catalyst is optionally entrapped in the gas stream, which is converted into a plasma stream prior to contacting the nanostructure precursors to the catalysts in the resulting plasma stream, e.g., by exposing the stream to a radio frequency or microwave field. The catalyst is optionally entrapped in the gas stream by pulsing a catalyst target with a laser, thereby vaporizing a portion of the catalyst target and releasing catalyst into the gas stream. The catalyst is optionally on a movable (e.g., motorized) stage that is moved to provide release of a regulated, e.g., constant, amount of catalyst by the laser. The laser is optionally controlled by a feedback loop, also to assist in regulating release of catalyst.

As with other embodiments herein, the nanostructure precursor typically comprises a group II, group II, group IV, group V, or group VI compound, e.g., silicon. The nanostructure precursor optionally comprises a dopant, e.g., any of those noted herein. The nanostructures produced are any of those noted herein.

The nanostructure precursors are introduced into the flowing stream before, during or after introduction of the catalyst. For example, nanowire precursors are optionally preheated in the flowing gas stream before contacting the catalyst. The precursors optionally contact the catalyst in a reaction chamber in which the catalyst is released from a catalyst target by pulsing the target with a laser. The catalyst is optionally entrapped in a gas stream and converted into a plasma by flowing the gas stream through a radio frequency or microwave field. The precursor is optionally entrapped in an additional gas stream that is preheated prior to being exposed to the plasma in a reaction chamber.

The extraction optionally includes condensing the nanostructures on a cold substrate. The method also optionally includes extracting gas or plasma downstream of a site where the nanostructures are extracted. The gas or plasma is optionally scrubbed.

In these embodiments, systems for practicing the methods are also a feature of the invention. For example, a continuous phase nanostructure synthesis system is provided. The system includes a gas or plasma source, a nanostructure synthesis region, and a flow path that permits flow of gas or plasma from the gas or plasma source to the nanostructure synthesis region. The system also includes a nanostructure catalyst source coupled to the synthesis region, a nanostructure precursor source coupled to the synthesis region, and a nanostructure extraction site coupled to the synthesis region. Optionally, the system includes a gas or plasma extraction region downstream of the synthesis region, configured to flow gas from the gas source to the gas extraction region during synthesis of the nanostructure in the synthesis region.

The gas or plasma source optionally comprises a noble gas source, e.g., an He source or an Ar source. The plasma source is optionally coupled to a gas source, wherein a gas is flowed from the gas source through a radio frequency or microwave field to produce the plasma. The nanostructure catalyst, precursor and dopant can be any of those noted above. Optionally, the nanostructure synthesis region comprises a target that comprises the catalyst. The system also optionally comprises a laser that releases the catalyst from the target during operation of the system. The laser optionally comprises a control loop that pulses the laser and a laser energy meter which are used to regulate the about of catalyst released from the target. The target is optionally motorized, permitting movement of the target relative to the laser and concomitant regulation of catalyst release from the target.

The flow path optionally comprises a gas preheater that preheats the gas prior to flow of the gas to the nanostructure synthesis region. An additional gas source and an additional flow path from the additional gas source to the synthesis region can also be incorporated into the system, along with a preheater that preheats gas in the additional flow path. For example, the precursor source is optionally coupled to the additional gas source and the system optionally includes system instructions that direct the precursor to be flowed through the preheater prior to delivery of the precursor to the nanostructure synthesis region. Similarly, the gas or plasma source is optionally coupled to the catalyst source and the system optionally includes system instructions that direct the catalyst to be flowed into the synthesis region.

The nanostructure extraction site typically includes a substrate that is sufficiently cold to condense gas or plasma comprising a nanostructure onto the substrate. The gas or plasma extraction region optionally comprises a scrubber that scrubs the gas or plasma to remove nanostructures from the gas or plasma.

Another class of embodiments relates to methods of functionalizing nanostructures, including any of those made by any of the preceding methods. For example, methods of making a functionalized nanostructure or nanostructure precursor are provided. The methods include treating the nanostructure or precursor with a functionalizing plasma, whereby a functional group is attached to the precursor or nanostructure. Any suitable functionalizing chemistry can be used in this process, including, e.g., where the functionalizing plasma comprises ammonia, nitrogen, a primary amine, or hydrogen. The precursor is optionally subsequently incorporated into a nanostructure. Nanostructures made according to these methods are also a feature of the invention. Similarly, a plasma that includes a functionalizing precursor and a nanostructure precursor or a nanostructure is also a feature of the invention. A nanostructure comprising a functionalized outer surface, e.g., a nitride layer is a feature of the invention.

Typically, the functional group is attached to the outer surface of the nanostructure. This can provide an insulating layer on the nanostructure and/or a site for chemical attachment of additional moieties.

Kits comprising any of the above nanostructures, devices, arrays, systems or the like, e.g., comprising instructions for the use of the nanostructures, devices, arrays, systems in the methods herein are also a feature of the invention. Kits optionally further include end use features, containers for storing other components of the kit, packaging materials and the like.

DEFINITIONS

The following definitions are directed to the current application and are not to be imputed to any related or unrelated case, e.g., to any commonly owned patent or application.

Before describing the present invention in detail, it is to be understood that this invention is not limited to particular devices or biological systems, which can, of course, vary. It is also to be understood that the terminology used herein is for the purpose of describing particular embodiments only, and is not intended to be limiting. As used in this specification and the appended claims, the singular forms "a", "an" and "the" include plural referents unless the content clearly dictates otherwise. Thus, for example, reference to "a substrate" optionally includes a combinations of two or more substrates; reference to "nanowire" optionally includes mixtures of nanowires, and the like.

Unless defined otherwise, all technical and scientific terms used herein have the same meaning as commonly understood by one of ordinary skill in the art to which the invention pertains. Although any methods and materials similar or equivalent to those described herein can be used in the practice for testing of the present invention, the preferred materials and methods are described herein. In describing and claiming the present invention, the following terminology will be used in accordance with the definitions set out below.

An "array" of nanostructures is an assemblage of nanostructures. The assemblage can be spatially ordered (a "patterned array") or disordered (a "randomly patterned" array). The array can form or comprise one or more functional elements (e.g., a junction or collection of junctions) or can be non-functional.

A "functional element" is a component of a circuit, device, detector, or system. Examples include wires, current paths, transistors, diodes, rectifiers, amplifiers, and many others known to one of skill.

A "nanostructure" is a structure having at least one region or characteristic dimension with a dimension of less than 500 nm, e.g., less than 200 nm, less than 100 nm, less than 50 nm, or even less than 20 nm. In many cases, the region or characteristic dimension will be along the smallest axis of the structure. A conductive or semi-conductive nanostructure often displays 1-dimensional quantum confinement, e.g., an electron can often travel along only one dimension of the structure. Examples of nanostructures include nanowires, nanotubes, nanodots, nanorods, nanotetrapods, quantum dots, nanoribbons and the like. A "homonanostructure" is a nanostructure that has an essentially homogeneous arrangement of constituent elements. For example, a homonanowire is a homonanostructure that can be a substantially single crystal structure comprising a base material such as silicon and, optionally, a dopant dispersed in essentially the same manner throughout the crystal. A "heteronanostructure" is a nanostructure that includes subdomains comprising different compositions. For example, a heteronanowire is a heteronanostructure that can be a single crystal structure comprising a base material such as silicon with different subdomains or "segments" having different dopants, or different concentrations of one dopant, or an entirely different material, or any combination thereof. For embodiments that utilize flow alignment, the nanostructures of the invention typically have an aspect ratio greater than 5, typically greater than 10, generally greater than 50, and, optionally, greater than 100 or more.

A "nanowire" is an elongated nanostructure having at least one cross sectional dimension that is less than about 500 nm e.g., less than about 200 nm, less than about 100 nm, less than about 50 nm, or even less than about 20 nm or less, and has an aspect ratio (e.g., length:width) of greater than about 10, preferably, greater than about 50, and more preferably, greater than about 100. A nanowire is optionally substantially single crystal in structure (a "single crystal nanowire" or a "monocrystalline nanowire"). It is optionally conductive or semiconductive. A "homonanowire" is a nanowire that has an essentially homogeneous arrangement of constituent elements. For example, a homonanowire can be a single crystal structure comprising a base material such as silicon and a dopant dispersed in essentially the same manner throughout the crystal. A "heteronanowire" is a nanowire that includes subdomains comprising different compositions. For example, a heteronanowire can be a single crystal structure comprising a base material such as silicon, with different subdomains or "segments" having different dopants, or different concentrations of one dopant, or both. Examples of nanowires include semiconductor nanowires as described in Published International Patent Application Nos. WO 02/17362, WO 02/48701, and 01/03208, carbon nanotubes, and other elongated conductive or semiconductive structures of like dimensions. Particularly preferred nanowires include semiconductive nanowires, e.g., those that are comprised of semiconductor material selected from, e.g., Si, Ge, Sn, Se, Te, B, Diamond, P, B—C, B—P(BP6), B—Si, Si—C, Si—Ge, Si—Sn and Ge—Sn, SiC, BN/BP/BAs, AlN/AlP/AlAs/AlSb, GaN/GaP/GaAs/GaSb, InN/InP/InAs/InSb, BN/BP/BAs, AlN/AlP/AlAs/AlSb, GaN/GaP/GaAs/GaSb, InN/InP/InAs/InSb, ZnO/ZnS/ZnSe/ZnTe, CdS/CdSe/CdTe, HgS/HgSe/HgTe, BeS/BeSe/BeTe/MgS/MgSe, GeS, GeSe, GeTe, SnS, SnSe, SnTe, PbO, PbS, PbSe, PbTe, CuF, CuCl, CuBr, CuI, AgF, AgCl, AgBr, AgI, BeSiN$_2$, CaCN$_2$, ZnGeP$_2$, CdSnAs$_2$, ZnSnSb$_2$, CuGeP$_3$, CuSi2P$_3$, (Cu, Ag)(Al, Ga, In, Tl, Fe)(S, Se, Te)$_2$, Si3N$_4$, Ge3N$_4$, Al$_2$O$_3$, (Al, Ga, In)$_2$(S, Se, Te)$_3$, Al$_2$CO, and/or an appropriate combination of two or more such semiconductors. In certain aspects, the semiconductor may comprise a dopant from a group consisting of: a p-type dopant from Group III of the periodic table; an n-type dopant from Group V of the periodic table; a p-type dopant selected from a group consisting of: B, Al and In; an n-type dopant selected from a group consisting of: P, As and Sb; a p-type dopant from Group II of the periodic table; a p-type dopant selected from a group consisting of: Mg, Zn, Cd and Hg; a p-type dopant from Group IV of the periodic table; a p-type dopant selected from a group consisting of: C and Si.; or an n-type is selected from a group consisting of: Si, Ge, Sn, S, Se and Te.

"Substantially single crystal" refers to a structure that has long-range order over at least 100 nm in at least 1 dimension within the structure. It will be understood that a substantially single crystal nanowire may contain defects or stacking faults and still be referred to as substantially single crystal as long as long-range order is present. In addition, the surface of a nanowire can be either single crystalline, polycrystalline or amorphous without affecting the description of the overall nanowire as being substantially single crystal. In the case of a non-single crystalline surface, the nanowire is considered to be single crystal if it comprises a substantially single crystal core extending radially from the center of the wire more than ⅕ of the distance to the surface, preferably ½ of the way to the surface.

A "controlled length nanostructure" is a nanostructure produced under conditions that regulate, in a controlled or controllable manner, the length of the nanostructure produced.

A "nanostructure catalyst" is a material that facilitates the formation or growth of a nanostructure. For example, under appropriate conditions, colloids such as gold act as nanostructure catalysts.

DETAILED DESCRIPTION

Introduction

Figure 1:
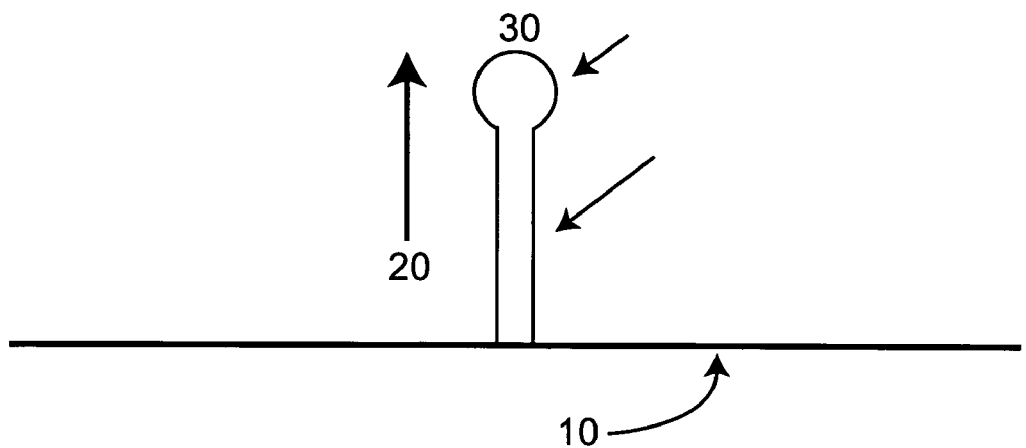
FIG. 1 is a schematic of a nanostructure growing from a substrate.

The present invention provides a variety of methods of making and arranging nanostructures such as nanowires, e.g., into functional devices, arrays or device or array components. The following discussion focuses first on the formation of nanostructures and nanostructure arrays via patterning, then focuses on oriented growth in magnetic fields and then on fluidic assembly of nanostructure arrays. Harvesting of nanostructures from a substrate via etching (including use of etch planes for making nanostructures such as nanowires with defined ends and/or controlled lengths) and manufacturing of nanostructures on substrates and integration with IC by planar processing methods is then covered. Power directed orientation and growth of nanostructures, template directed nanostructures growth and radial nanostructures deposition are addressed. Large scale growth of nanostructures, e.g., by continuous gas and plasma phase synthesis approaches are then covered, followed by nanostructure functionalization via functionalizing plasmas. Integration of nanowires into biosensors and device elements is then addressed.

It will be appreciated that the synthesis methods herein can be used to make nanostructures used in any of the ordering approaches herein. Furthermore, methods of modifying nanostructures, e.g., via functionalizing plasmas are also described and can be applied to any of the manufacturing or array/device approaches herein. Various methods of making nanostructures, device components and whole devices (e.g., biosensors) using the methods herein are also discussed.

For ease of description, the following discussion often focuses on one or another type of nanostructure (e.g., nanowires) but it will be appreciated that the same basic assembly/ordering/production methods herein, in most cases, can be applied to nanostructures generally, e.g., any other small/1-dimensional component such as nanowires, nanodots, nanotubes, nanoribbons, nanotetrapods, quantum dots or the like can be made/ordered/arranged using the methods and systems herein. In addition, certain structures that can fall outside of the definition of nanostructures, such as semiconductor whiskers, can also be assembled/ordered/produced by the methods herein.

Formation of Nanostructures S and Nanostructures Arrays Via Patterning

In one aspect, the present invention provides methods of forming nanowires (or any other small or one-dimensional structure, e.g., a nanodot, nanoribbon, nanotetrapod, etc.) and corresponding arrays with any of a variety of properties by patterning nanostructure catalysts and/or precursors on a substrate. Nanostructure catalysts and/or precursors are heated, melting into spheres that influence the eventual diameter and location of nanostructures made from the spheres. The nanowires or other structures produced by the methods can be homostructures (homonanowires), heterostructures (heteronanowire) and can be formed into functional or non-functional elements. For example, the wires can form junctions, transistors, field effect transistors, amplifiers, circuits, diodes, gates, emitters, collectors, p-type gates, sensors, memory, or the like, or can be simple arrays of nanowires.

Figure 9A:
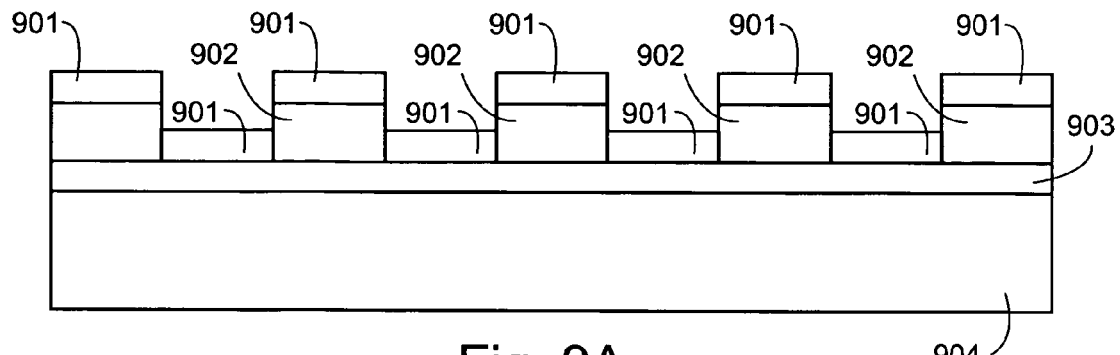
FIG. 9 schematically illustrates formation of an array of catalyst particles via patterning with a resist.
Figure 9B:
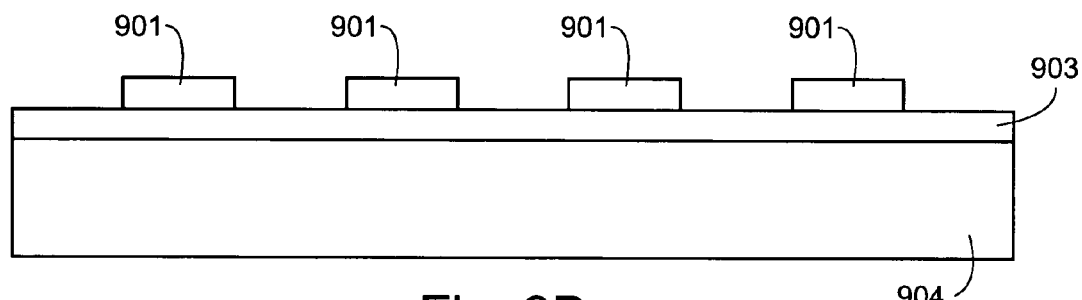
Figure 9C:
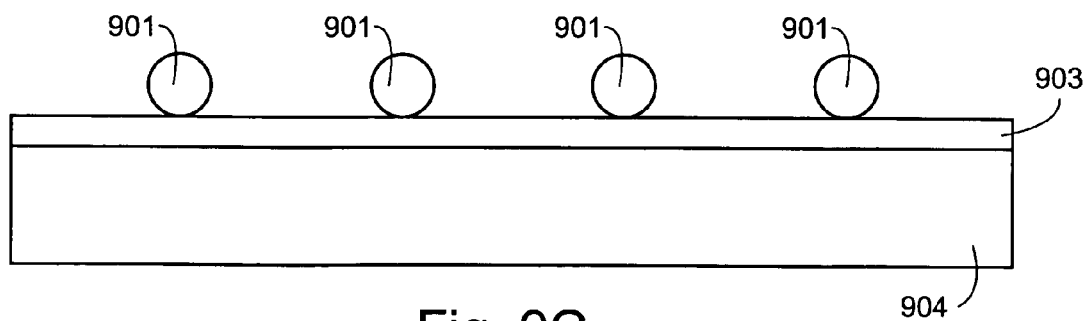

Patterning of a catalyst on a substrate is illustrated in FIG. 9. As shown, substrate 904 (e.g., a silicon wafer) comprising coating 903 (e.g., silicon dioxide) is first patterned with resist 902 and then layered with catalyst 901 (e.g., gold) (Panel A). As shown in FIG. 9, panel B, catalyst 901 is lifted off by removing resist 902. The catalyst is then reformed, e.g., via heating to form spheres (9C).

In these methods of forming nanostructures, a nanostructure catalyst is patterned on a substrate in a plurality of patterned elements. The patterned elements are typically of a thickness and shape such that a corresponding sphere diameter for the patterned element is less than a selected nanostructure (upon addition of nanowire catalyst, the sphere volume becomes approximately equal to the selected nanostructure, e.g., nanowire). As described above, the sphere diameter is actually the effective diameter of a liquid drop, with the wetting-characteristics of the materials used in contact with the substrate surface. The catalyst can be essentially any nanostructure catalyst material, e.g., a metal. Examples of suitable materials include gold, iron, cobalt, manganese and sliver. The nanostructure catalyst is heated to form nanostructure catalyst spheres and nanostructure precursors are added to form spheres of catalyst and precursor (generally, the addition of the precursors is performed at approximately the same time as the catalyst is heated, though the catalyst or the precursor can be added before or after the heating step). Alternatively, the catalyst can be heated prior to addition of the precursor and precursor addition can occur prior to sphere formation. Nanostructures are then formed from the catalyst/precursor spheres.

The shape and thickness of the patterned elements and the interaction of the element constituents with the substrate determine droplet formation characteristics of the catalyst and catalyst/precursor materials. The shape and thickness of the elements is selected to provide any desired drop formation characteristics. In one simple embodiment, the patterned elements are simply formed as disks, but any other geometric shape can be used, as long as the thickness and shape provide for droplet formation. The parameters for shape formation include surface tension of melted catalyst/precursor components, friction between the melted catalyst/precursor components and the substrate, gravity, the presence or absence of centripetal forces and the like.

One can also test any postulated droplet formation properties simply by making a patterned element to a desired shape/thickness and empirically determining the droplet formation characteristics of the patterned element.

In general, the method optionally includes a step of selecting a desired nanostructure diameter and selecting a corresponding sphere diameter to determine the desired nanostructure diameter. The sphere diameter can be selected in part by empirically determining droplet formation characteristics of the nanostructure catalyst on a selected surface. Droplet formation is controlled by controlling lateral or thickness dimensions, or both, of the patterned elements. Thus, the method optionally includes selecting thickness or surface dimensions of the patterned elements to control sphere formation. The method optionally includes selecting a plurality of desired nanostructure diameters, selecting a plurality of sphere diameters to equal the plurality of desired nanostructure (e.g., nanowire) diameters, and depositing a plurality of patterned elements to generate that plurality of sphere diameters. Sphere formation can optionally be controlled by controlling the rate of heating and the rate of precursor addition.

Most typically, the patterned elements aggregate into single droplets when heated in the presence of the nanostructure precursors. The formation of single droplets provides better sphere size control than patterning element that break into multiple droplets—although this later approach can be used as well, e.g., where the size of nanostructures grown from spheres can vary in the application of interest. In general, however, it is advantageous to structure the patterned elements such that they aggregate single droplets of a pre-selected size. This provides the greatest level of control over the final nanostructure diameter. Here again, one can empirically determine whether the patterned elements aggregate into single droplets when heated and what the resulting diameter is, for each configuration. Parameters such as temperature, rate of temperature change, presence or absence of nanostructure precursor gasses during or prior to heating, as well as timing and rate of precursor introduction and relative rates of different precursor components in binary and higher-order materials all be used to control the formation of droplets and promote single-drop vs multi-drop formation.

In an alternative embodiment, the substrate can be pre-patterned in such a way as to promote droplet formation in specific locations on the substrate. This can be done with patterned catalyst that coats the entire substrate, or just covers the patterned locations. One example of patterning could be an etched pit (or pinhole) that creates a high-surface tension at on location on the substrate and promotes aggregation of the melted catalyst at that location. Depending on the size and spacing of such locations, this process can be used to control the size and density of catalyst drops that form on a surface. This can be either periodic or non-periodic.

The single droplets can be substantially uniform in size, or not substantially uniform in size across an array. The distribution of sizes of patterned elements (and, thus, spheres and nanostructures formed from the elements) can vary in a selected fashion, e.g., in a manner that is not simply the result of manufacturing variation. The user can select to place nanostructures of any diameter in any location by placing patterned elements with appropriate characteristics in those locations. Thus, the size of the patterned elements can display a non-Gaussian size distribution. For example, where two general nanostructure sizes are useful in the final application, the patterned elements aggregate into single droplets that display a bimodal volume distribution. Where 3 sizes are desirable, the patterned elements aggregate into single droplets that display at a trimodal volume distribution. In general, the number of desired sizes in the final application (n) will lead to an n-modal volume distribution of droplets and a corresponding n-modal size/shape/thickness distribution of patterned elements.

As noted, the nanostructure catalyst/precursor spheres form an array of droplets, from which an array of nanostructures are grown. The array can be a regularly ordered array or an irregular array, depending on the intended application. The nanostructures or other components of the array can be homostructure or heterostructure elements, also depending on the intended application. For example, nanowires can be of a substantially uniform diameter, or can be of varying (non-uniform) diameter. The nanowires can comprise silicon or other materials, and can be doped or non-doped. The precise size, array arrangement and composition of the array and nanostructures within the array are dependent on the application to which the array is to be put. Applications of this technology include, but are not limited to, cold-cathodes, field-emission arrays, laser diodes arrays, LED arrays, solid adhesives, thermoelectric coolers, thermogenerators, photovoltaic cells, transistor arrays, biosensor arrays, and the like.

As noted above, the catalyst materials which are patterned on the substrate can be essentially anything that can function as a nanostructure catalyst, e.g., a gold, iron, etc. catalyst. The array of patterned catalyst elements can include one or more than one catalysts component. These components can be separated into different elements in the array (e.g., one patterned element optionally includes gold while another includes iron), or can be combined into a single patterned element (e.g., a patterned element can include gold, or iron, or both gold and iron). In addition to varying in composition, the patterned elements optionally differ in volume. Patterned elements that differ in volume or composition can be patterned sequentially or simultaneously. The various steps of the methods can also be performed recursively, e.g., by repeating patterning, catalyst/precursor addition/heating steps performed on a first set of nanostructure catalysts/precursors on a second set of nanostructure catalysts/precursors. This cycle can be performed as many times as desired, until the array achieves a desired complexity. This ability to increase array complexity by patterning different types of nanostructures into the array during different rounds of nanostructure assembly permits the formation of highly complex arrays.

In certain embodiments, it may be desirable to remove any of the remaining catalyst/precursor material after the growth of a set of nanostructures and before the growth of a second cycle. This can be done by selective etching, for example with an acidic etchant, to remove the metal catalysts over the semiconductor nanostructures (in another embodiment, the nanostructure can simply be etched below the catalyst, e.g., by incorporating an appropriate selectively etchable material into the nanostructure, as described in more detail herein). The use of etch planes to provide uniform wire cleavage points is described below in more detail and can be performed in this application.

It is also possible, using the methods of the present invention, to grow different composition nanostructures simultaneously by using catalyst materials of different compositions. In another embodiment, a set (e.g., an array) of structures of one composition is grown, and the remaining catalysts from the ends of the structures is removed. Catalysts are redeposited back onto the substrate surface and a second composition of nanostructures is grown intermixed randomly or in an ordered manner within the original set (array). One application of this embodiment is in thermoelectric devices, where one desires both n- and p-doped thermoelectric channels, to provided for running heating and/or cooling in parallel on the same substrate.

In any case, the patterned elements that differ in volume or composition can be formed into functional components, e.g., by crossing component types in the arrays. That is, a first type of nanostructure can be formed in one region of the array, with a second type of nanostructure being formed in another region of the array. These regions can intersect to provide functional elements through the interaction of different types of nanostructures. For example, the nanostructures can interact to form functional elements such as a transistor, an LED, a laser, a biosensor, a logic circuit, memory, a heating or cooling element, and/or the like.

It will be appreciated that the arrays produced by any of the methods noted herein are a feature of the invention. For example, arrays of nanostructures having an arbitrary (e.g., a selected) pattern of a plurality of nanostructures, each nanostructure having a given (e.g., selected) diameter are a feature of the invention. The arbitrary pattern can be a randomly or non-randomly selected pattern. The nanostructures of the array can be the same or different, and can comprise heterostructure or homostructure nanostructures. The nanostructures can be substantially uniform or non-uniform in diameter. The nanostructures can differ or be the same with respect to composition, size uniformity, spacing in the array, or the like. The arrays can form functional or non-functional elements (e.g., can form one or more of: an LED, a laser, a biosensor, a logic circuit, and/or memory).

It will also be appreciated that the arrays of patterned elements and spheres noted above are an additional feature of the invention. For example, in one aspect, the invention provides a patterned array of nanostructure catalyst elements on a substrate, where a volume of a plurality of the patterned elements has a sphere diameter less than a nanostructure. The diameter of the sphere volume corresponding to the patterned catalyst elements is less than the diameter of the nanostructure, because, in general, the volume of the patterned catalyst elements plus the nanostructure precursors determines the nanostructure diameter.

The patterned elements can include elements which differ in size or composition as noted above. The patterned elements can be patterned in any suitable catalyst material, e.g., colloidal gold, iron, or the like. Thus, in one embodiment, a first set of patterned elements comprises gold and a second set of elements comprises iron. The patterned elements will generally include the catalyst(s) of interest and optionally include the precursors. Alternately, the nanostructure precursors can be added after the catalysts are patterned on the substrate. In yet another alternate arrangement, the nanostructure precursors are patterned on the substrate and the catalysts are added to the patterned precursors. In any case, the various principles noted above can be applied. The spheres formed from the patterned elements and any added components (e.g., nanowire precursors, e.g., where the patterned elements do not comprise the precursors, but do comprise the catalysts) can also differ in size or composition as noted above. Thus, the invention also provides an array of nanowire catalyst/nanowire precursor spheres on a substrate, where a volume of a plurality of the spheres have sphere diameters approximately equal to a nanowire.

Oriented Growth in Magnetic Fields

The present invention provides a variety of methods of orienting and directing nanostructure growth which can be applied in a number of the other embodiments herein. In one class of embodiments, methods of growing nanowires in a selected direction or orientation are provided, in which a magnetic field is applied to a eutectic interface between a nanowire crystal and a catalyst mixture comprising a magnetic colloid and a nanowire precursor.

A variety of ways of generating the magnetic field can be used, e.g., via an electromagnetic grid, an electromagnet grid, a magnetic grid, or the like. That is, the magnetic field can comprise or be produced using any of these components. The method optionally includes altering the direction of the magnetic field during growth of the nanowire, thereby influencing the direction or orientation of nanowire growth.

Figure 10:
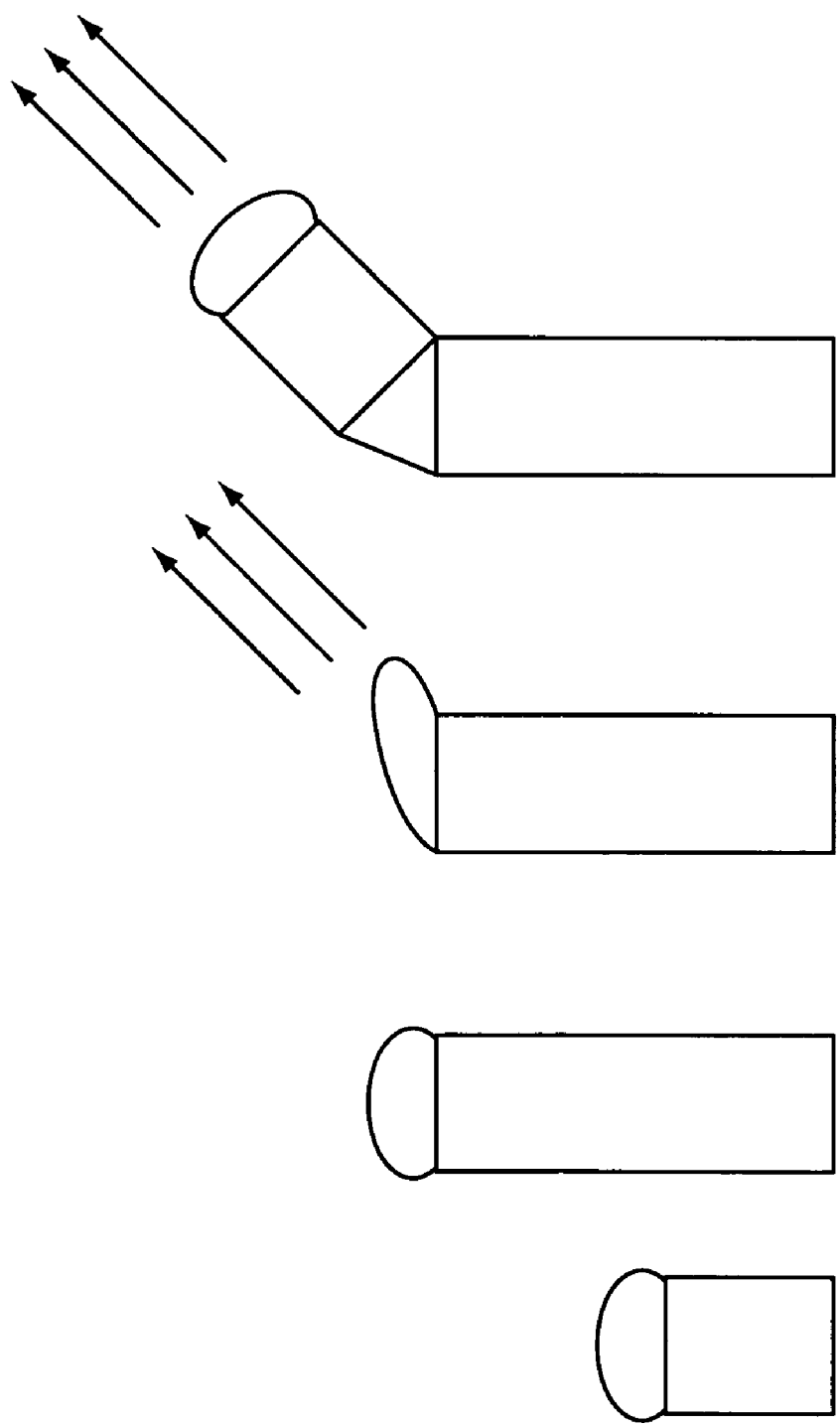
FIG. 10 schematically illustrates alteration of nanostructure growth upon application of a magnetic field.

This embodiment is further illustrated in FIG. 10. As shown on the left hand side of the figure, growth of a nanostructure in the absence of a magnetic field is upwards (in this example). As shown on the right hand side, application of a magnetic field (illustrated by arrows) results in growth in the direction of the magnetic field. The nanostructures are shown with a catalyst cap.

The colloid can include magnetic materials such as iron. Similarly, the precursor can include any appropriate nanowire precursor material, such as silicon, doped silicon or the like. The product nanowires of the methods can include heterostructure nanowires, homostructure nanowires, or both.

Systems for practicing the methods are also a feature of the invention. For example, systems can include a nanowire crystal, a catalyst mixture comprising a magnetic colloid proximal to or in contact with the crystal, an electrical, magnetic, or electromagnetic field generator and a controller which directs orientation or intensity of a magnetic field produced by the magnetic field generator. The systems also optionally include additional features such as a user interface which permits a user to direct the controller to direct the orientation or intensity of the magnetic field.

Fluidic Assembly of Nanowire Arrays

In one aspect, the methods of the invention include making arrays by flowing nanostructures into contact with one another. The nanostructures can be individually addressable, with each nanostructure captured in a particular position and/or orientation in a particular region, or the assembly can be addressed via group capture methods (or even via stochastic assembly). The composition of an individually addressed array of nanostructures can be predetermined, such that the presence of a selected nanostructure at each position in the individually addressable array is pre-selected. Alternately, the presence of a selected nanostructure from a nanostructure set or suspension at each position in the individually addressable array can be not pre-selected.

In either case, the method can include determining which nanostructures are positioned in which positions in the individually addressable array. For example, position can be determined by detecting one or more property of each of the nanostructures and comparing the property to a nanostructure property look-up table.

One arrangement for capturing nanostructures involves forming surfaces that comprise regions that selectively attract nanostructures. For example, —$NH_2$ can be presented in a particular pattern at a surface, and that pattern will attract nanowires or nanotubes having surface functionality attractive to amines. Surfaces can be patterned using known techniques such as electron-beam patterning, soft-lithography, or the like. See also, International Patent Publication No. WO 96/29629, published Jul. 26, 1996, and U.S. Pat. No. 5,512,131, issued Apr. 30, 1996.

In several embodiments, assays are performed using the nanostructure arrays. Optionally, the nanostructures are released following use and fresh nanostructures can be flowed into position to form additional nanostructure arrays. Thus, array construction/deconstruction can be performed in real time as compared to the assays that are run using the arrays. This ability to quickly assemble and disassemble nanostructure arrays, in any desired configuration, provides many advantages, particularly when the arrays can be used only once in the assay at issue. For example, many assays involve irreversible binding of materials to the nanostructures, which prevents further use of the nanostructure array in the assay at issue.

Accordingly, in a first aspect, the invention includes methods of performing an assay in which at least a first set of nanostructures is flowed into position to form a first array of nanostructures, performing an assay, which produces an assay result that is detectable by the first array, and, detecting the assay result. The nanostructures which are flowed into position can be reversibly or irreversibly positioned in place. In embodiments in which the assay comprises irreversible binding of an analyte to at least one member of the first set of nanostructures, it is desirable for the positioning of the nanostructures to be reversible, because the arrays are essentially "single-use" arrays. That is, it is desirable to form a new array anytime the assay permanently alters (e.g., modifies or damages), a previous array.

In one preferred embodiment, methods of making arrays of nanostructures are provided in which at least a first set of nanostructures is flowed into position to form a first array of nanostructures, where the nanostructures of the first array are reversibly immobilized in position. The first array of nanostructures is then disassembled or moved by unimmobilizing the first set of nanostructures, or the first array, or both. At least a second set of nanostructures is flowed into position to form a second array of nanostructures, where the nanostructures of the second array are reversibly immobilized in position. The reversible immobilization can include any method of achieving reversible binding, e.g., binding the nanostructures to a substrate via one or more reversible chemical bonds, applying fluidic pressure to the nanostructures, applying an electric field to the nanostructures, and/or applying a magnetic field to the nanostructures, or the like. The reversible immobilization optionally includes individually locating and positioning at least one of the nanostructure, e.g., where the members of an array are "individually addressable." In an alternate embodiment, the members of the array are not individually positioned, but are, instead, positioned as nanostructure types or other nanostructure sets, e.g., by capturing groups that share a common feature (e.g., a size dimension, presence of a capture moiety (e.g., a magnetic or ferric particle, an antibody or the like), and/or that are released or flowed as a group in the fluidic system.

The arrays are most typically spatially ordered arrays, e.g., assemblies of nanostructures that form regularly spaced components. However, the arrays can be randomly ordered, or can include randomly ordered regions, e.g., show a random spatial pattern of assembly. Different types of nanostructures can be flowed from different sources of the nanostructures to form the arrays, e.g., where the nanostructures are flowed from fluidic suspensions of different types of nanostructures. Thus, in one aspect, a first type of nanostructure is flowed from a first source and a second type of nanostructure is flowed from a second source to provide a set (e.g., the first or second set noted above) or an assemblage (e.g., array) of nanostructures.

Accordingly, the arrays which are assembled can include more than one type of nanostructure, e.g., where assemblies of nanowires provide a functional element such as an assay element. For example, the array can comprise semiconducting nanowires such as n-type semiconducting nanowires and/or p-type semiconducting nanowires. It will be appreciated that a variety of device elements, such as diodes, rectifiers, transistors, amplifiers and the like, can be constructed from p-n or various p-n combination (e.g., pnp, npn, pin, pip, etc.) junctions.

In this regard in general, the nanowires or other structures which are assembled into arrays are optionally doped, e.g., in a conventional manner using conventional dopants such as B, P, As, Ga, In and/or Al. Both the nanowire or other nanostructure materials and the dopant materials can be selected from, e.g., Groups II, III, IV, V, VI, etc., and can include quaternaries and tertiaries, as well as oxides. Different nanostructure semiconductor types can be assembled by the methods herein, e.g., group III-V semiconductor nanowires, group II-VI semiconductor nanowires, group II-IV semiconductor nanowires, etc.

Nanowires can be homonanowires (having the same basic structure throughout) or heteronanowires (having regions of different structure, e.g., regions which differ by dopant). In addition, the nanowires can comprise molecules permanently or temporarily attached to the surface of the nanowires. For example, the first or second sets of nanowires noted above are optionally attached to the same or to different chemical or biological moieties. Thus, the nanowires of the arrays which are assembled by this method can differ or be the same with respect to properties (e.g., semiconducting vs. conducting or non-conducting), presence, absence or type of dopants, presence, absence or type of bound moieties (chemical, biological, structural, etc.), basic composition, or the like.

The plurality of nanostructure members of the first or second or any subsequently assembled array are optionally in electrical contact with each other. This electrical contact can be any type of electrical contact, whether direct or indirect.

In general, the arrays of the invention can be used to perform one or more assay of interest. For example, one or more assay can be performed on or with the first array and the results of the assay detected, followed by flowing the second set of nanostructures into position and performing an assay on or with the second array. This process can be repeated until the source of nanostructures is depleted (and, of course, the source can be replenished (or continuously replenished) and the process continued as desired.

The assay results can comprise a detectable signal such as product mass (e.g., the mass of an assay product can be detected on the array), an optical emission (e.g., emission of light, e.g., a fluorescent or luminescent emission), an electrical emission from the array, a change in conductivity of the nanostructure array, an magnetic field produced by a product (e.g., captured by the array), a product binding event (e.g., binding of an antibody or antigen to the array), or the like. Thus, detection modalities can include flowing an electric current into or proximal to the first or second array, detecting an optical signal, or the like. The different arrays that are constructed in by the fluidic system can be used to perform the same or different assays and, thus, can involve detection of the same type of signal or of different signal types.

Systems for performing the methods are also a feature of the invention. For example, a system of the invention can include a first source comprising a first suspension of nanostructures as noted above. The system can also include a fluid conduit (e.g., a channel or channel network, e.g., a microfluidic channel or channel network) coupling the first suspension of nanostructures to a nanostructure array construction region, which is configured to reversibly detain nanostructures from the first suspension such that the nanostructures in the suspensions are connected into an operable nanostructure array. The system further optionally includes a controller which regulates reversible detention of the nanostructures in the nanostructure array construction region.

In general, many methods and systems for moving fluids, e.g., in microfluidic systems are well set forth in the literature. Fluid movement methods include pressure-based fluid movement, electrokinetic based fluid movement and capillary action-based fluid movement. Systems for moving fluids from fluid sources into microscale channels can include glass, polymer or rubber microfluidic chips that include or can be coupled to external fluid sources. These systems can be adapted to the present invention by incorporating suspensions of nanostructures into the fluid sources of such devices and using the devices to move and position nanostructures.

Microscale channels in these commercially available systems typically have at least one cross-sectional size dimension on the order of 500 µm or less, and typically less than 100 µm, often about 10 µm–about 50 µm. Another approach to determining whether a channel has microscale dimensions is to consider the flow properties of fluid in the channel microchannels have dimensions that provide low Reynolds number operation, i.e., for which fluid dynamics are dominated by viscous forces rather than inertial forces. Reynolds number, sometimes referred to the ratio of inertial forces to viscous forces is given as:

$$Re = \rho d^2/\eta\tau + \rho u d/\eta$$

where u is the velocity vector, $\rho$ is the fluid density, $\eta$ is the viscosity of the fluid, d is the characteristic dimension of the channel, and $\tau$ is the time scale over which the velocity is changing (where $u/\tau = \delta u/dt$). The term "characteristic dimension" is used herein for the dimension that determines Reynolds number, as is known in the art. For a cylindrical channel it is the diameter. For a rectangular channel, it depends primarily on the smaller of the width and depth. For a V-shaped channel it depends on the width of the top of the "V", and so forth. Calculation of Re for channels of various morphologies can be found in standard texts on fluid mechanics (e.g. Granger (1995) *Fluid Mechanics*, Dover, N.Y.; Meyer (1982) *Introduction to Mathematical Fluid Dynamics*, Dover, N.Y.). Fluid flow behavior in the steady state ($\tau \rightarrow$ infinity) is characterized by the Reynolds number, $Re = \rho u d/\eta$. Because of the small sizes and slow velocities, microfabricated fluid systems often operate under a low Reynolds number regime (Re less than about 1). In this regime, inertial effects, that cause turbulence and secondary flows, and therefore mixing within the flow, are low and viscous effects dominate the dynamics. Under these conditions, flow through the channel is generally laminar (though under pressure based flow the flow can be parabolic). In certain embodiments, the channel with a typical nanowire containing fluid provides a Reynolds number less than about 0.001. Since the Reynolds number depends not only on channel dimension, but on fluid density, fluid viscosity, fluid velocity and the timescale on which the velocity is changing, the absolute upper limit to the channel diameter is not sharply defined. In fact, with well designed channel geometries, turbulence can be avoided for R<100 and possibly for R<1000, so that high throughput systems with relatively large channel sizes are also useful.

The system optionally includes any of a variety of fluid handling components, such as sample sources (e.g., wells, chambers, microtiter trays, or other containers), channel networks (e.g., fluidic channels through which nanowires are flowed), microscale channels or channel networks, fluid controllers (e.g., including pressure sources, electrokinetic controllers, combinations of such elements, etc.), and the like. The sample sources and channels can be fluidly coupled, e.g., in a single integrated device. For example, microfluidic devices that include one or more channel networks can include fluid sources comprising nanowire suspensions, or can be coupled to such fluid sources. Microfluidic devices are commercially available from Caliper Technologies (Mountain View, Calif.). For example, the Caliper 250 HTS™ is a system that couples a microfluidic chip to external fluid sources such as microtiter plates by sipping fluids through sipper capillaries which extend from the device. In the current invention this or similar systems can be adapted to the present invention by placing suspensions of nanowires or other nanostructures in the external fluid sources (e.g., microtiter plates) and the various fluid movement systems of the device can be used to transport and position nanowires. Other commercially available systems include the Agilent Technologies 2100 bioanalyzer™ co-developed by Caliper and Agilent. In this system, the fluid sources are wells on top of the chip. In the context of the present invention, these fluid sources would be filled with nanowire suspensions and the system used to move and position nanowires. Other companies which describe various microfluidic systems include Aclara Technologies (Mountain View, Calif.) (e.g., the Aretas™), and Fluidigm (South San Francisco, Calif.) (e.g., the Fluidigm Starter-Kit™).

The present invention, therefore, can include first, second, third, . . . n sources of nanowires or other nanostructures, comprising first, second, third, . . . nth suspensions of nanowires/nanostructures. The suspensions can be the same or different, e.g., the nanostructure compositions can vary based on size, shape, type, composition, population characteristics, or the like. For example, nanowires of the suspensions can be heterostructures or homostructures, or mixtures thereof. The suspensions can be placed into fluid sources such as wells, chambers, or other containers. The suspensions are flowed from the source to a destination, e.g., a site where the nanowires are assembled into arrays or any into any other functional element. The suspensions are flowed through channels or channel networks, e.g., microscale channels or channel networks.

The systems optionally include any of a variety of detection systems for detecting a property of or signal emitted from the array. Any available detection system can be used, e.g., a detection system that detects a mass signal (e.g., a mass-spectrometer or biacore type device, or changes in modulation frequency of a piezoelectric nanowire upon binding of an analyte), an optical signal (e.g., a microscope, CCD array, photo-diode, photo-emitter, or the like), an electrical signal or property (a conductivity meter, detection of a transmitted electron, or the like), a magnetic signal, a force signal, or a combination thereof. Signals or properties can be detected from single nanowires/nanostructures or the arrays, or subportions of the arrays.

The detectors can comprise or be operably coupled to a digital or analog converter (an "A/D converter") which converts an analog signal from the signal detector into digital data, or a digital signal from the detector into analog information, or both. The system can also further include a data storage module operably coupled to the signal detector or to the converter, which stores signal data from the signal detector. The data storage module can be, e.g., a component of a computer, such as a hard-drive, CD-ROM, memory, or the like.

Any of a variety of assays can be performed using the arrays produced using the methods herein. Example assays include assays which detect presence or concentration of a chemical or biological molecule, assays which provide for genotyping a sample, e.g., by detecting an SNP, assays for detecting an antigen, assays for detecting an antibody, assays for detecting a nucleic acid, assays for detecting a protein, assays for detecting a hazardous material, assays for detecting a chemical or biological warfare agent, or the like.

It will be understood that the term "flow" as used herein does not necessarily require a continuous fluid motion of the materials. The term flow is used to describe the transport to or from a location. In this case, an operator transferring nanostructures from a sample bottle to an array location, followed by diffusion of the wires into the final array form would be considered "flowing" the wires to the array locations. In some embodiments, however, samples are flowed through channels, for example form a microfluidic system, to and from their array locations. This is also covered by the term "flow."

Harvesting Wires from a Substrate

In one aspect, the invention provides methods of harvesting nanostructures (nanowires, nanotubes, nanodots, quantum dots, etc.) from a substrate. The methods include etching away an etchable portion of the nanostructure, or an etchable material in contact with the nanostructure, to release the nanostructure from the etchable portion or etchable material.

Corresponding systems are also a feature of the invention. For example, the systems of the invention can include, e.g., an etchant and one or more nanostructure comprising an etchable portion, or an etchant and one or more nanostructure coupled to an etchable material.

As in the other embodiments noted herein, the nanostructure can comprise a heterostructure nanostructure (a "heteronanostructure"), or can comprise a homostructure nanostructure. The nanostructures are optionally doped as in the other embodiments noted herein, e.g., in a conventional manner using conventional dopants such as B, P, As, In and/or Al. Both the nanostructure materials and the dopant materials can be selected from, e.g., Groups II, III, IV, V, VI etc., and can include quaternaries and tertiaries, as well as oxides. Different nanostructure semiconductor types can be assembled by the methods herein, e.g., group III-V semiconductor nanostructures, group II-VI semiconductor nanostructures, group II-IV semiconductor nanostructures, etc. The nanostructures can be homonanostructures (having the same basic structure throughout) or heteronanostructures (having regions of different structure, e.g., regions which differ by dopant). In addition, the nanostructures can comprise molecules permanently or temporarily attached to the surface of the nanostructures. For example, the first or second sets of nanostructures noted above are optionally attached to the same or to different chemical or biological moieties. Thus, the nanostructures of the arrays which are assembled by this method can differ or be the same with respect to properties (e.g., semiconducting vs. conducting or non-conducting), presence, absence or type of dopants, presence, absence or type of bound moieties (chemical, biological, structural, etc.), basic composition, or the like.

The etchable material can include an etchable substrate. The etchable substrate optionally comprises a layer of etchable material over a layer of a non-etchable material. Alternately, the etchable substrate can be etchable throughout the substrate. The etchable material can alternatively or additionally include an etchable attachment site to a substrate, or an etchable region of the nanostructure that is differentially etchable from a non-etchable region of the nanostructure. The method can include etching a single etchable portion for each nanostructure, or a set of etchable portions for each structure, thereby releasing sets of nanostructures. Similarly, a single etchable region of a substrate or other material in contact with the nanostructure can be etched, or a set of etchable materials in contact with a set of nanostructures can be etched, thereby releasing the set of nanostructures (e.g., releasing nanowires, nanotubes or nanodots).

Any common etchable material can be used to form the etchable portion or material, e.g., silicon oxide, or other available oxides. In fact, many selectively etchable materials and corresponding etchants are known in the art, and all can be used in the present invention. The etchable portion or material of the nanostructure can include different etchable materials, to provide for differential release of nanostructures from the array. Similarly, the etchable materials can be etched with one or more etchant, e.g., which provide specific activity against one or more etchable materials, providing additional control over release of etchable materials. Common etchants include dry etchants, wet-etchants, isotropic etchants, anisotrpic etchants and various selective etchants such as acids, bases and HF.

The systems of certain embodiments also optionally include an etchant controller which controls placement of the etchant onto the etchable portion or material, or which controls a duration of contact between the etchant and the etchable portion or material. Optionally, the etchant controller receives feedback from the system regarding the degree of etching achieved by the etchant and controls further contact of the etchant and the etchable portion or material in response to the feedback. Etchant controllers control distribution of etchant materials and can include or be operably coupled to etchant dispensing modules, e.g., fluid flow components (e.g., conventional fluid flow channels or conduits such as microfluidic channels or channel networks), robotic handlers, power sources or any other features that contain, transport or control contact of etchant e.g., coupled to system software, a user interface, a computer or the like. If present, the user interface optionally accesses the system software to direct controller operations, e.g., to provide for selection of any alternative operations that the system is capable of (e.g., selection of the etchant, contact time between the etchant and any etchable material, placement of etchant, removal of etchant, or the like).

The following two sections describe variations of this method, first in describing time controlled doping and etch-based cleavage to produce controlled length nanostructures and then by describing various planar processing approaches to integrating conventional IC and nanostructures.

Controlled Etching, Including Controlled Dopant Introduction and Controlled Dopant Etching Nanostructures such as nanowires are typically grown in an essentially random or stochastic way. This results in nanostructures having random lengths and having features of interest (e.g., junctions) at unpredictable lengths from any given end of a nanowire. Furthermore, for heteronanostructures, random synthesis methods make it difficult to make a nanostructure with a change in dopant or other feature (e.g., a junction, or a region with differing material composition) in a defined part of the nanostructure. That is, because the nanostructures are of random lengths, changes in dopants or other features are also random.

In one aspect, the present invention overcomes these difficulties by providing methods and systems for making controlled length nanostructures via differential etching of regions of the nanostructures (e.g., where the nanostructure comprises a first and a second material, where the first and second material are differentially etchable), e.g., using adaptations of the methods previously described. In one specific embodiment, the first or second material comprises a dopant that is more or less susceptible to the relevant etchant than the first or second material.

For example, by doping nanostructures during growth from a substrate (or simply altering material composition from a first material to a second material), etch planes can be defined for removing the nanostructures from the substrate. This permits nanostructures such as nanowires to be grown with doping changes, junctions, or other structures of interest at defined places relative to the ends of the nanostructures. This facilitates construction of a variety of arrays and devices (and device arrays) as well as simplifying a variety of fabrication techniques.

For example, in one embodiment, a method of placing a particular feature, such as a heterojunction, a specified distance from one end of a nanostructure such as a nanowire is provided. For example, the feature can be a heterojunction such as a p-n junction or a junction between a doped and non-doped region of the nanostructure (e.g., nanowire), or any other feature of interest. One can grow a nanostructure (e.g., nanowire) with an etchable region followed by a defined length of nanostructure (e.g., nanowire) growth before the feature (e.g., junction). Then, by etching the etchable region, the wire is released with the feature (e.g., junction) an exact defined distance from the end of the structure. For example, in one specific embodiment, a nanowire is grown that comprises silicon for 10 nm followed by germanium for 10 nm followed by 50 microns of n-doped silicon followed by 50 microns of p-doped silicon. The structure is then exposed to a germanium etch that dissolves the second segment, releasing a p-n nanowire junction exactly 50 microns from either end. In general, there can be an extra etchable region in addition to the heterojunction or other feature of interest. This etchable region can be a doped region (if an etch that selectively etches doped vs non-doped material is used), or a non-doped region, or can include any material that is selectively etchable as compared to the rest of the nanostructure.

In a related embodiment, a doped eutectic catalyst colloid or patterned material is heated to form catalyst balls. For example an Au/Si ball with B doping can be made. If this is then grown in a $SiH_4$ or $SiCl_4$ ambient, the end of the wire is doped from the catalyst ball, and can be cleaved or used electronically (e.g., as a contact). Starting with a eutectic can ease initiation and improve uniformity of final products.

In any case, in overview, the methods of making one or more controlled length nanostructures can include, e.g., depositing at least one nanostructure catalyst on a substrate and growing a nanostructure from the catalyst in a nanostructure growth process that includes periodically introducing one or more material (e.g., a dopant) during growth of the nanostructure. Thus, there are typically at least two material types in the nanostructure, e.g., a first material and a second material—either of which can comprise, e.g., a dopant. The first and second material are differentially etchable, showing different cleavage properties when exposed to the relevant etchant. This controllable incorporation of material into the nanostructure during the growth process provides nanostructures with defined regions of materials. The resulting nanostructure is exposed to an etchant (e.g., as described above) that differentially etches different regions of the nanostructure (e.g., doped or non-doped), controllably cleaving the nanostructure into one or more controlled length nanostructures. These nanostructures can include any feature of interest.

Similarly, systems for practicing the methods are also a feature of the invention. In overview, the systems can include a substrate and a source of a nanostructure catalyst. The system can include instructions for transporting the catalyst to the substrate and for depositing the nanostructure catalyst on the substrate. A source of a nanostructure precursor can be included along with a source of a second material (e.g., a dopant) and system instructions for transporting the nanostructure precursors from the nanostructure precursor source to the substrate and into contact with deposited nanostructure catalyst, under conditions suitable for nanostructure growth. Typically, the system will also include system instructions for periodically introducing the materials from relevant sources to the substrate during growth of the nanostructure, thereby providing for controlled introduction of the materials during growth of the nanostructure. The system can include a source of etchant that differentially etches, e.g., doped or non-doped regions of the nanostructure (e.g., where the one of the material sources comprises a dopant) and instructions for introducing the etchant into contact with the nanostructure, thereby controllably cleaving the nanostructure into controlled length nanostructures. The system can include a system timer for measuring or controlling the length of time that any relevant material is introduced during nanostructure manufacture.

In the methods and systems, at least one nanostructure catalyst(s) is typically deposited on a substrate. The substrate can be any material suitable for growth of the nanostructure of interest, e.g., ceramics such as glass, silicon wafer materials, polymers, metals, metalloids or the like. For example, the substrate can be, e.g., a semiconducting crystalline material, a polymer, an amorphous surface, silicon, glass, quartz, alumina, or gallium arsenide. The substrate can include features which aid in nanostructure formation, e.g., by providing retaining features for the nanostructure catalyst(s) such as wells, pits, depressions, trenches, channels, or the like. The deposition can be performed by any available method, e.g., via lithography (e.g., photolithography) or simply via colloid deposition. The catalyst(s) can be any that catalyzes growth of the desired nanostructure. Examples include metals such as gold, iron, cobalt, manganese and sliver. System instructions can direct any of these processes, e.g., by directing the relevant catalyst deposition components of the system, e.g., robotics, fluid dispensers, illumination sources, or the like.

A nanostructure is grown from the catalyst in a nanostructure growth process that includes periodically introducing one or more dopant during growth of the nanostructure. One common nanostructure growth process comprises that can be applied to the present invention is controlled vapor deposition of one or more nanostructure precursors onto the catalyst. Other methods can also be used, e.g., vapor liquid solid growth (VLS), laser ablation (laser assisted catalytic growth) and thermal evaporation. In any case, the periodic introduction of one or more dopant during growth results in controlled incorporation of the dopant into the nanostructure during the growth process. That is, the dopant concentration varies along the length of the nanostructure as a function of the concentration of the dopant at different time points during the synthesis of the nanostructure. Thus, the resulting (hetero)nanostructure can have regions that include dopant and regions that do not, and/or regions of high and low dopant concentration. The heteronanostructure can have any feature that is not destroyed by the etching process. Where a dopant is introduced, the invention is not limited to the use of conventional dopants, but conventional dopants such as B, P, As, Ge, Ga, In and/or Al can be used in the methods and systems of the invention. Any of the nanostructure precursor materials and/or dopant materials can be selected from, e.g., Groups II, III, IV, V, VI, etc., and can include quaternaries and tertiaries, as well as oxides. Different nanostructure types can be assembled by the methods herein, e.g., group III-V semiconductor nanostructures, group II-VI semiconductor nanostructures, group II-IV semiconductor nanostructures, etc. As noted, the etchable region does not need to comprise a doped region at all, but can be any etchable material that is differentially etchable as compared to the rest of the nanostructure.

The resulting controllably doped nanostructure is exposed to an etchant that differentially etches (and thereby cleaves) doped or non-doped regions of the doped nanostructure, thereby controllably cleaving the nanostructure into one or more controlled length nanostructures. Any common etchable material can be used to form the etchable portion of the nanostructure, e.g., silicon oxide, or other available oxides. In fact, many selectively etchable materials and corresponding etchants are known in the art, and all can be used in the present invention. The etchable portion or material of the nanostructure can include different etchable materials, to provide for differential release of nanostructure segments from the substrate. Similarly, the etchable materials can be etched with one or more etchant, e.g., which provide specific activity against one or more etchable materials in the controllably doped nanostructures, providing additional control over cleavage of etchable materials in the structures. Common etchants include dry etchants, wet-etchants, isotropic etchants, anisotrpic etchants and various selective etchants such as acids, bases (e.g., $NH_3OH$) and HF. In one example, the dopant is $B_2H_6$ and the etchant is $NH_3OH$. In another example, the nanostructure is a Si nanostructure with a Ge dopant and the etchant is one that shows selectivity for SiGe over Si. System instructions that direct flow of dopants or etchants from relevant sources to sites of action are an optional feature of the invention.

Cleavage by the etchant can result in nanostructures with defined features at the cleaved ends of the nanostructures. For example, the nanostructure can be cleaved such that the ends of the nanostructure comprise (or do not comprise) one or more dopant. This can result in the ends of the nanostructure providing one or more conductive or semiconductive contact region for the nanostructure. Thus, the nanostructure (e.g., nanowire, nanotube, nanorod, nanotetrapod, or nanodot) optionally comprises one or more conductive or semiconductive end region that can be used as a contact pad for the nanostructure to provide a point of interface with one or more external feature or element. For example, the nanostructure can be incorporated into one or more transistors, e.g., one or more npn or pnp transistors, or into rectifiers, diodes, gates, amplifiers and/or the like. Such elements form the basic elements of a circuit, which, in turn, provide the basic element of essentially all electrical devices.

It will be appreciated that a resulting feature of these methods include populations of controlled length nanostructures. These controlled length populations can be used in ways that random stochastic populations can not. For example, the populations can be used simultaneously to provide one or more component of one or more electrical circuits. For example, if one, two, three, four or more different nanostructure lengths are needed in a particular application, the population can be produced to provide one or more of these different lengths. The nanostructure populations can be separated into individually sized nanostructure lengths for a particular end use. In one aspect, a population of nanostructures that comprises substantially similar lengths and dopant material composition is provided, in which the dopant material is heterogeneously distributed through the nanostructures. Such nanostructure populations can include nanowires, nanotubes, nanorods, nanotetrapods, nanodots, and/or the like.

In one related aspect, arrays of nanostructures are provided. For example, the arrays can comprise any of the features noted herein for controlled length nanostructures or nanostructure populations. In one aspect, the arrays include a substrate having a plurality of nanostructures projecting therefrom, where the nanostructures have dopant material similarly distributed in a plurality of regions of the nanostructures. Typically, the distribution of the dopant material is non-uniform. As with the nanostructure or nanostructure populations already noted, such nanostructure populations can include nanowires, nanotubes, nanorods, nanotetrapods, nanodots, and/or the like. The arrays can be incorporated into or produced by the systems of the invention. The arrays can be assembled, e.g., using any of the methods herein.

In the systems herein, the system instructions are typically embodied in a computer or in/on a computer readable media. The system can provide the instructions noted above, and, additionally, other desirable features such as providing instructions for making a nanowire, nanotube, nanorod or nanodot.

Figure 2:
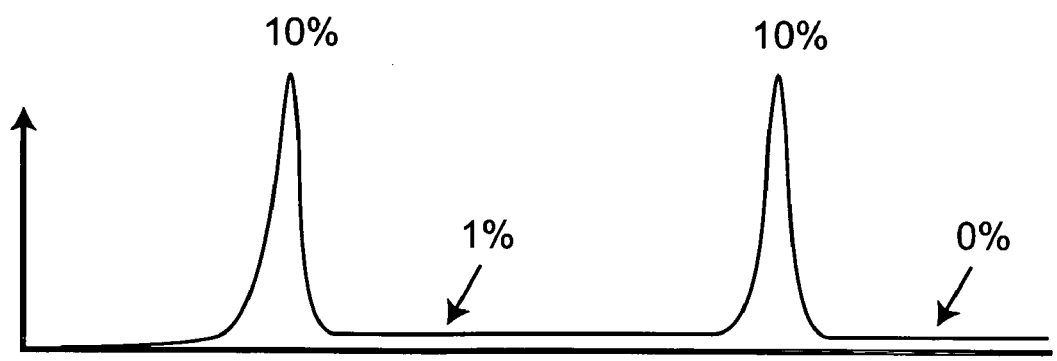
FIG. 2 is a schematic of a graph of time-controlled dopant introduction, and a resulting nanostructure.
Figure 2:
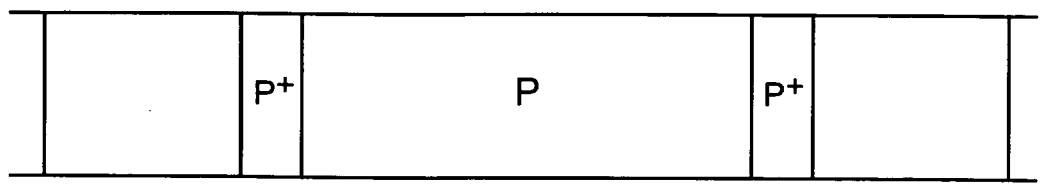
Figure 3:
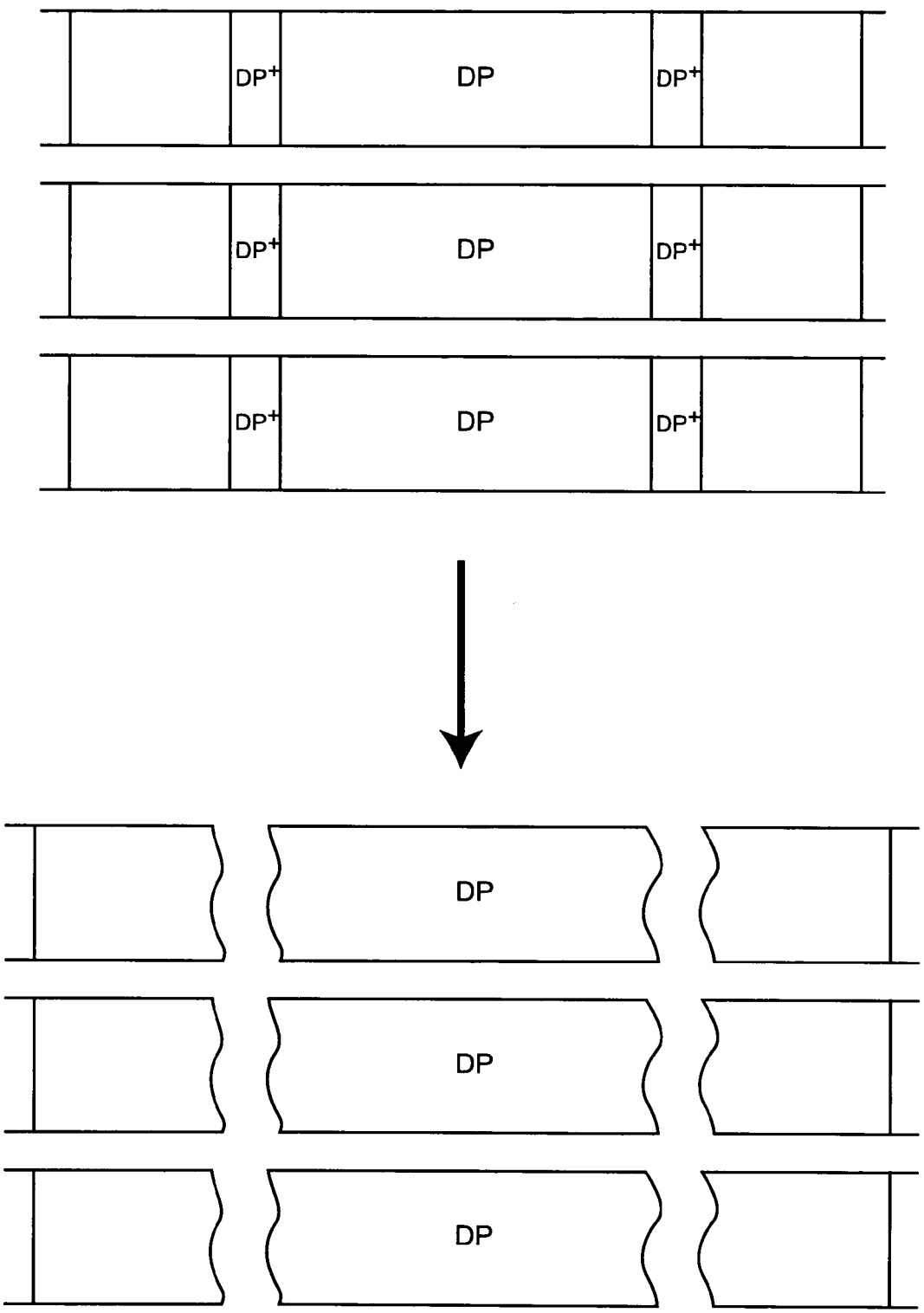
FIG. 3 is a schematic of cleavage of a nanostructure.

FIGS. 1–3 illustrate example embodiments of these methods. In FIG. 1, substrate 10 is shown with nanostructure 20 comprising catalyst 30 growing from the substrate during controlled vapor deposition growth of the wires. FIG. 2 illustrates a time versus dopant concentration plot, illustrating dopant levels (Dp) at different time points and the resulting nanostructure. FIG. 3 illustrates an etch strategy, showing cleavage of the nanostructure and the resulting cleavage fragments.

Integration of Nanostructure Fabrication and Planar Processing

Due to decreasing feature sizes of integrated-circuit devices, the need for increasingly fine, lithographically-defined patterning is a limiting aspect of the technology. A growing amount of effort is being devoted to self-assembly techniques to form nanoscale elements; see, e.g., Collier et al., (1999) "Electronically Configurable Molecular-Based Logic Gates," Science, 285, 391–394 as a way to overcome these difficulties.

In the present invention, self-assembled nanostructures can form their own devices or device elements, or can be integrated on a standard integrated circuit (IC) so that they can be driven by conventional integrated electronics in the underlying substrate (most electronics utilize integrated circuits produced by planar processing of a silicon oxide surface). To use the nanostructures, nanoscale connections to the rest of the integrated circuit used. The nanostructures are anchored at locations defined by any relevant underlying circuitry and are optionally composed of materials compatible with Si integrated-circuit processing where such processing is desired. The nanostructures optionally comprise features useful for particular applications, e.g., analyte (e.g., biomolecule) attachments for detection of molecule that bind analyte, and the like. Chemistries for such attachments are described herein and are generally available.

Nanostructure use is limited by the need to produce optimized electrical contacts and the ability to produce "free-standing" devices that comprise the nanostructures. An attractive way of using nanostructures is to produce the structures via standard planar processing methods (e.g., photolithographic) methods, e.g., as used in creating conventional integrated circuits, optionally including those to which the nanostructures are attached. The advantage to such planar processing approaches is that one can make many devices or device elements simultaneously. However, it can be difficult to provide for attachment of analytes to a nanowire on a substrate, e.g., when attaching analyte molecules to the nanostructure. The present invention overcomes this difficulty, as well as providing methods for integrating IC and nanostructure manufacture.

Accordingly, the invention provides methods of making nanostructure devices via planar processing methods that, optionally, integrate with standard integrated circuit technology. In overview, a substrate is provided and a nanostructure catalyst particle is deposited on the substrate. This deposition is by any standard method, e.g., via standard masking strategies. In addition, catalyst particles can be moved once initially laid down via methods such as electrophoresis. The catalyst particles are conveniently laid down such that they can provide for growth from an element on the substrate (e.g., an IC element) that is to be interfaced with the nanostructure of interest. This initial catalyst particle placement can be used, at least in part, to direct growth of the nanostructure, e.g., providing placement of the nanostructure on the substrate, e.g., relative to IC on the substrate.

A nanostructure is grown from the catalyst particle, thereby providing a nanostructure growing from the substrate (or feature on the substrate) with a catalyst particle at one end of the nanostructure (the end distal to that attached to the substrate or feature on the substrate). The end comprising the catalyst particle is then coupled to one or more electrical contacts (e.g., by growing the particle into place, and/or optionally by moving the particle via electrophoresis or application of a magnetic field). Nanostructure devices made according to this method are also a feature of the invention.

Any appropriate substrate as described herein can be used, e.g., semiconducting crystalline materials, polymers, amorphous surfaces, silicon, glass, quartz, alumina, gallium arsenide, etc. The catalyst particle can be any of those noted herein, e.g., gold, iron, cobalt, manganese, sliver or the like. Silicon or similar substrates are particularly preferred for their ability to form or interface with conventional IC, and catalyst particles and nanostructures compatible with such substrates are also preferred.

Depositing the nanostructure catalyst optionally comprises etching the substrate, masking the etched substrate, and laying catalyst particles on the area accessible through the mask. Thus, initial etching and masking, e.g., via standard lithographic methods, provides the initial placement of the catalyst, which controls, at least in part, contact between the nanostructures and other (e.g., IC) elements in the final structure. The electrical contacts are optionally coupled to each end of the nanostructure (and, optionally, to any standard integrated circuit features) by regular planar processing (e.g., photolithography).

In one embodiment, a nanostructure device comprising a substrate having a nanostructure is provided. The nanostructure is coupled to a particle at least at one end of the nanostructure, wherein the particle is coupled to an electrical contact. The nanostructure device is optionally coupled to a functional (e.g., electrical) contact at each end of the nanostructure, e.g., where the structure is grown from a suitable contact point and then coupled to a second suitable contact point. The nanostructure is optionally oriented in the same plane as the substrate, or in a plane perpendicular to the substrate.

Figure 7:
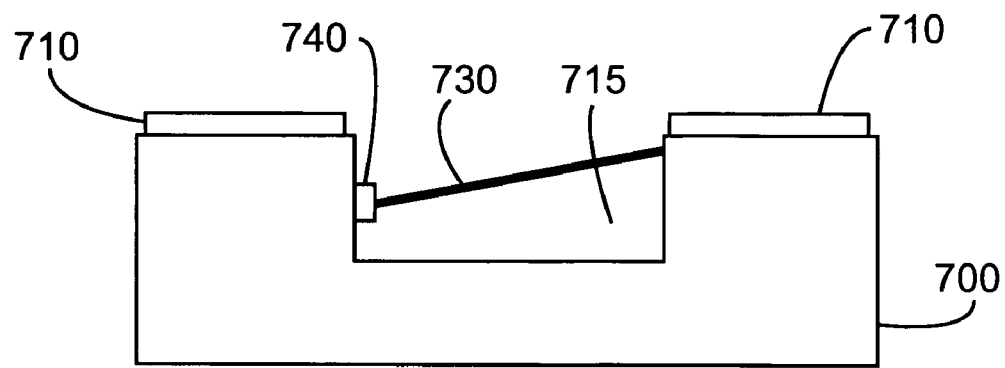
FIG. 7 schematically illustrates a nanostructure on a substrate.
Figure 8:
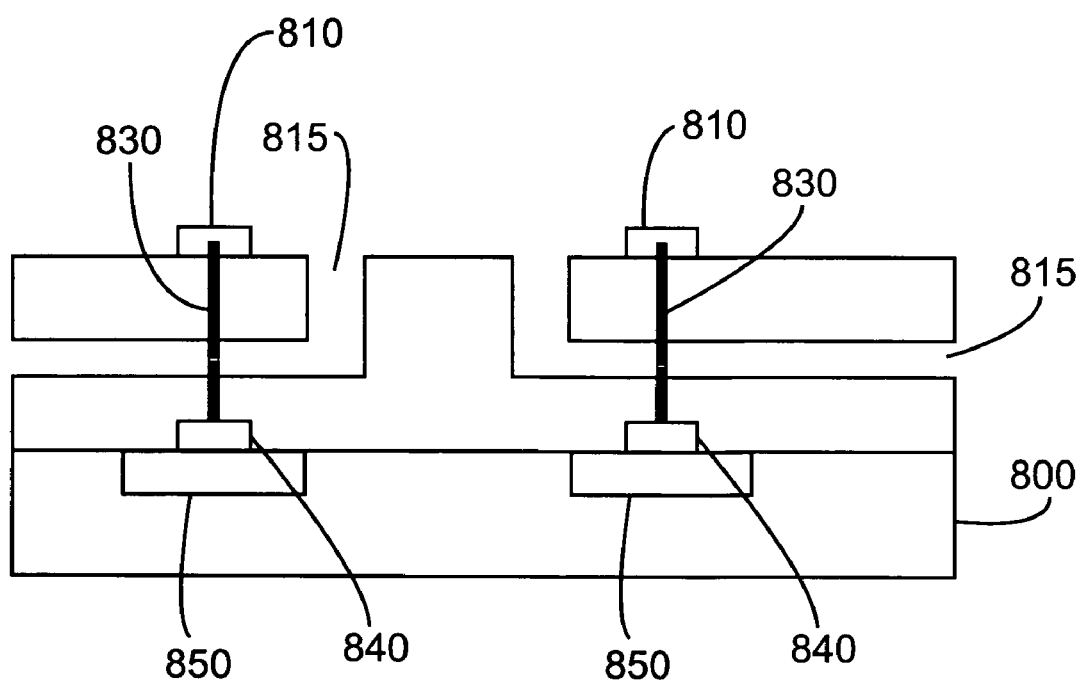
FIG. 8 schematically illustrates a system for planar processing of a nanostructure.

FIGS. 7 and 8 provide examples of planar processing approaches to make nanostructure devices. FIG. 7 provides an example in which the nanostructure is grown parallel to the substrate, while FIG. 8 provides an example where the wire is grown perpendicular to the substrate. As illustrated, the examples include the following steps. First, a silicon oxide or other suitable substrate is provided. Features are etched in the substrate to provide an area to lay gold or other catalyst particles down on the substrate. An area of the substrate is masked for deposition of the catalyst particles (the particles can also be moved on the substrate via electrophoresis for further refinement of catalyst particle positioning. Excess catalyst covered regions are etched away. Silane or other suitable materials are flowed to grow the nanostructures. The catalyst particle-tipped end of the nanostructure is attached to a desired point on the substrate (or on another feature such as a pinout, connector or another nanostructure) by heating or electrophoresis. This process is repeated until the desired features are formed on the substrate. As depicted, contact 710 (e.g., a metal pad) is laid on substrate 700 to either side of channel 715. Wire 730 comprising catalyst particle 740 is grown from substrate 700. The site of attachment of the catalyst particle to the substrate can be controlled via electrophoresis.

FIG. 8 depicts a variation in which the nanostructures are perpendicular to the substrate. As shown, wires 830 are grown across fluid channels 815 from contact pads 810 towards substrate 800. Catalyst tipped wire end 840 contacts doped region 850 of substrate 800, thereby providing a connection to the substrate.

Power Directed Orientation and Growth of Nanostructures

Methods of controlling nanostructure orientation and growth using electric or magnetic fields (or both) are also a feature of the invention.

In a first embodiment, methods of controlling growth of a nanostructure are provided in which an electric field is provided between two electrodes. The electrodes act as nanostructure catalysts. A nanostructure is grown between the electrodes, with the electric field directing nanostructure formation. Nanostructure contact between the electrodes, or a change in capacitance between the electrodes is detected and the electric field is modified in response to the nanostructure contact or the change in capacitance. Nanostructures can be grown from a source electrode to a destination electrode. Using this terminology, either or both electrodes can be the source or the destination electrode. That is, the nanostructure can be grown unidirectionally from a source towards a destination, or at least two nanostructures can be grown simultaneously from source electrodes that are also destination electrodes for an oppositely growing nanostructure.

Corresponding systems for controlling nanostructure growth are also provided, e.g., a system which includes a first electrode and a second electrode, where at least one of the electrodes comprises a nanostructure catalyst, a nanostructure precursor, a power source coupled to the electrodes, a detector which detects nanostructure contact between the two electrodes and a controller which controls the power source in response to a signal from the detector.

In the methods and systems, the electric field typically can direct the direction, orientation, or diameter of nanostructure formation. For example, the orientation of the electric field directs the direction of nanostructure growth. The intensity of the electric field controls the rate of nanostructure growth. A power source typically is coupled to the electrodes to provide the electric field.

Automatic detection of the nanostructure (e.g., nanowire) contact or a change in capacitance can be performed with an electric circuit that measures current flow between the electrodes. For example, automatic detection can be performed with a circuit comprising a resistor which shunts current away from the path between the electrodes through the nanostructure upon the electrodes being electrically coupled by the nanostructure. In general, the system is configured to modify the electric field, e.g., by reducing the intensity of the electric field. The electric circuit can be coupled to or integral with the detector or the controller of the system. The electrical circuit, e.g., comprising a resistor, is coupled to the first electrode, the second electrode, or both the first and second electrodes. It will be appreciated that in one simple embodiment, the detector and the controller are provided by a single electrical circuit comprising a resistor, which is coupled to the first electrode, the second electrode, or both the first and second electrodes.

The approach can be multiplexed to generate multiple nanostructures, e.g., by growing multiple nanostructures in an array of electrodes. For example, the methods can include growing a plurality of nanostructures between a plurality of electrodes, where the plurality of additional electrodes act as nanostructure catalysts and the electric field or one or more additional electric fields (e.g., multiple electric fields optionally exist between different electrodes) direct additional nanostructure growth between the additional electrodes. Nanostructure contact between the plurality of electrodes is automatically detected as noted above and the electric field or fields is modified in response to the contact. For example, one or more electric circuits can include multiple resistors (e.g., one per pair of electrodes).

In one approach, the nanostructures are grown in the presence of a gate voltage, whereby the nanostructures are rendered non-conducting. This can be used to prevent burn out of the nanostructures resulting from contacting the electrodes. In another approach for reducing or eliminating nanostructure burn out, one can detect changes in capacitance, and the power can be shut off just prior to or immediately following contact by an electrode.

Most typically, the electrodes comprise a metal catalyst such as gold or iron. The nanostructure precursors typically includes silicon, but can include other materials and can be doped. For example, the nanostructures can be doped using conventional dopants such as B, P, As, In and/or Al. Both the nanostructure base materials and the dopant materials can be selected from, e.g., Groups II, III, IV, V, VI, etc., and can include quaternaries and tertiaries, as well as oxides. Different nanostructure semiconductor types can be grown between the electrodes, e.g., group III-V semiconductor nanostructures, group II-VI semiconductor nanostructures, group II-IV semiconductor nanostructures, etc. The nanostructures can be homonanostructures (having the same basic structure throughout) or heteronanostructures (having regions of different structure, e.g., regions which differ by dopant). In addition, the nanostructures can comprise molecules permanently or temporarily attached to the surface of the nanostructures.

Template Directed Nanostructure Growth

One aspect of the invention is the ability to grow nanostructures or other nanostructures with geometrically defined properties and to grow arrays of such nanostructures. In the methods, a nanowire (or other nanostructure) template is provided. The template is seeded with a nanowire (or other nanostructure) catalyst and nanowires (or other nanostructures) are grown from the template. The shape, direction, orientation or spatial position of the nanowires (or other nanostructures) is constrained by the template. Systems for making nanowires (or other nanostructure) are also a feature of the invention, e.g., systems which include a template seeded with a nanowire (or other nanostructure) catalyst and a nanowire (or other nanostructure) precursor. For simplicity, the following discussion focuses on nanowires, but it will be appreciated that the same basic approach can be used to produce other nanostructures such as nanotubes, nanodots, nanoribbons or the like, by essentially the same templated growth methods.

The nanowire template includes shaped regions such as pits, wells, trenches, channels or grooves into which the catalyst (e.g., a colloid) is seeded. The shaped region constrains the direction of nanowire growth, or the shape of the nanowires produced, or the position of the nanowires that are grown, or all of the above. The shapes can be produced by any available method, e.g., laser ablation, etching, or the like. The wells or other shaped regions can be evenly or irregularly spaced on the template. The template can include one type of shaped region (e.g., uniform pits or wells) or can include different shaped regions, e.g., combinations of differently shaped wells or pits, combinations of wells and trenches, or any other combination of shaped regions. The construction of different shaped regions gives rise to differently shaped or spaced nanostructures, which, in turn, can give rise to different functional elements on the array of nanostructures produced by the methods.

The nanowire catalyst will typically comprise a particle (e.g., comprise a colloidal suspension), but could also comprise a patterned element of the present invention. Examples include a metal particulate, e.g., a gold or iron particulate. The nanowire precursor materials can comprise any of a variety of materials, including metals, silicon or the like. The nanowires which grown from the seeded template are optionally doped materials, e.g., a semiconductor with any conventional dopant. For example, the conventional dopant can be e.g., B, P, As, In and/or Al. Both the base nanowire materials and the dopant materials can be selected from, e.g., Groups II, III, IV, V, VI, etc., and can include quaternaries and tertiaries, as well as oxides. Different nanowire semiconductor types can be assembled by the methods herein, e.g., group III-V semiconductor nanowires, group II-VI semiconductor nanowires, group II-IV semiconductor nanowires, etc. The nanowires can be homonanowires (having the same basic structure throughout) or heteronanowires (having regions of different structure, e.g., regions which differ by dopant). In addition, the nanowires can comprise molecules permanently or temporarily attached to the surface of the nanowires. The nanowires which are produced from the seeded template can also include different nanowire types, e.g., which differ with respect to one or more properties e.g., semiconducting vs. conducting or non-conducting, presence, absence or type of dopants, presence, absence or type of bound moieties (chemical, biological, structural, etc.), basic composition, geometric shape, length, or the like. This can be achieved by using a template that includes non-identical shapes, different seeded catalysts or that has different precursor materials applied to different portions of the template. Alternately, the nanowires produced from the array can all be the same, or can share any degree of similarity or difference that is desired. The nanowires can be heteronanowires, or homonanowires. Different portions of the template can support growth of different nanowire types (e.g., one portion can be configured to support heteronanowire growth and another portion can be configured to support homonanowire growth).

Radial Nanowire Deposition

In one aspect, the present invention includes methods of radially depositing nanostructures on a substrate. In the methods, nanostructures are suspended in solution and the resulting nanostructure solution is applied to a rotatable substrate. The rotatable substrate is rotated, resulting in deposition of the nanostructures onto the rotating rotatable substrate. Typically, this results in radial alignment of the nanostructures on the rotatable substrate.

The invention also optionally includes a system for radially aligning nanostructures according to the method. The system includes, e.g., a rotatable substrate adapted to receive nanostructures, and a rotation mechanism which is configured to rotate the rotatable substrate. The system optionally includes a suspension of nanostructures and a contact module which contacts the suspension of nanostructures to the rotatable substrate.

The nanostructures are optionally applied to the rotatable substrate prior to rotation of the rotatable substrate, but can also be applied to the rotatable substrate during rotation of the rotatable substrate.

The discussion above regarding the types of nanostructures and nanostructure suspensions in other application are equally applicable here. That is, the nanostructures can be homostructure nanostructures or heterostructure nanostructures of any of the various types noted herein.

Anchored Alignment

In another aspect of the current invention, an 'anchoring' strategy is used to control both the location and orientation of nanostructures. In this aspect, the catalyst material, present at the end of many nanostructures, is used as an anchor to localize one end of the nanostructure in a specific spatial location, and to control the orientation of the other end relative to that location. By chemically functionalizing the surface of the substrate such that it selectively binds only to the catalyst material at the extreme end of a nanostructure, we can control where that end will bind. For instance, with a gold colloid, a thiolated region on the substrate will selectively bind the end of the wire. Alternatively, specific functional groups can be conjugated to the gold colloid using standard thiol chemistry, and those groups can be used to localize the wires. For instance, an antibody labeled colloid can be used to localize one type of nanostructure in one location, while a different antibody on a second type of nanostructure will localize those to different locations.

In addition to the location of the end of the wire, if the wires are applied by a fluid flow-process, the fluid force on the nanostructure will tend to orient the other end of the structure away from the anchor point. In effect, the catalyst material acts like a pivot point for the wire. As such, it is possible to specifically locate nanostructures in a particular location and with a particular orientation relative to a flow. In addition, different nanostructures can be located and oriented differently by using different binding chemistries to attach the colloids to different locations on the substrate.

As an example, a batch of nanowires (type 1), fabricated using a gold catalyst is mixed with a thiolated biotin molecule. A second batch of nanowires (type 2), also fabricated with a gold catalyst, is mixed with a thiolated anti-rabbit IgG. The surface of a substrate is patterned with a specific electrode pattern, and mirocontact printing or pin-printing is used to deposit streptavidin on the tips of some electrodes and rabbit-anti-goat IgG on others. The electrode pattern has electrodes that extend from right to left. By flowing a combination solution of both nanowire types from right to left along the substrate, the wires of different types bind to their specific locations, and orient toward the second set of electrodes.

It will be apparent that many variation of this concept can be used to locate and orient nanostructures. Many different types of catalyst materials and many types of binding chemistry and flow-deposition processes can be used to achieve the same goal.

In a preferred embodiment, selective binding chemistry between a specifically functionalized location on a substrate and on a metal catalyst on the extreme end of a nanostructure is used to in combination with directional flow-deposition of the wires onto the substrate to anchor nanowires in a specific location with a defined orientation. In a further aspect of the current invention, additional functional groups can be added to the body of the nanowire and to other locations on the substrate to further facilitate precise placement and orientation.

Large Scale Growth

In one additional aspect, the invention provides large scale methods of nanostructure production. In these methods, a particulate nanostructure catalyst is provided to a fluid or aerosol reactor. Nanostructures are then grown from the particulate catalysts. Thus, the invention also provides systems for performing the method, e.g., including a particulate nanostructure catalyst, a fluid or aerosol reaction chamber and a nanostructure precursor. Nanowires are one particularly preferred embodiment for this approach In another embodiment, nanostructures are grown in a gas or plasma. Additional details regarding the gas/plasma embodiments are found below.

The discussion above regarding the types of nanostructures made according to these methods in other applications above are equally applicable here. That is, the nanostructures can be homostructure nanostructures or heterostructure nanostructures of any of the various types noted herein.

Gas and Plasma Phase Contiuous Reactor for Nanostructure Synthesis

A number of prior art methods of making nanostructures operate in a "batchwise" fashion. This means that nanostructures are typically made in small batches, e.g., using wafer based manufacturing. This is disadvantageous in some applications, because of the relatively low throughput of the system, low nanostructure yields and due to cost of batch materials such as wafers. One class of embodiments of the present invention feature continuous or semi-continuous manufacturing methods (and corresponding systems) that provide high yields, high throughput and the elimination of certain batch materials such as wafers for nanostructure manufacture.

In overview, the methods of making nanostructures include entrapping a nanostructure catalyst in a flowing gas or plasma stream, contacting the nanostructure catalyst with one or more nanostructure precursors, whereby the nanostructures are formed in the flowing gas or plasma stream and extracting the nanostructures from the flowing gas or plasma stream.

The corresponding systems, e.g., providing continuous phase nanostructure synthesis, include, in overview, a gas or plasma source, a nanostructure synthesis region, a flow path that permits flow of gas or plasma from the gas or plasma source to the nanostructure synthesis region, a nanostructure catalyst source coupled to the synthesis region, a nanostructure precursor source coupled to the synthesis region, a nanostructure extraction site coupled to the synthesis region, and, a gas or plasma extraction region downstream of the synthesis region. The nanostructure synthesis system is configured to flow gas from the gas source to the gas extraction region during synthesis of the nanostructure in the synthesis region.

In the methods and systems, the nanostructure catalyst is typically a colloid, e.g., a gold colloid solution. However, other catalysts, such as iron, cobalt, manganese or sliver colloids can also be used.

The gas (or gas source) can comprise one or more non-reactive (e.g., noble) gas, e.g., He or Ar. The plasma source is optionally coupled to a gas source, e.g., where a gas is flowed from the gas source through a radio frequency or microwave field to produce the plasma (high energy radio or microwaves are typically used to convert gas into plasma).

Nanostructure precursor materials can be any of those noted herein, e.g., comprising a group II, group III, group IV, group V, or group VI compound. In one example embodiment, the nanostructure precursor comprises silicon. The precursor can also include dopant materials. While the invention is not limited to the use of conventional dopants, such conventional dopants as B, P, As, Ge, Ga, In and/or Al can be used in the methods and systems of the invention. Either, or both, the nanostructure precursor materials and/or the dopant materials can be selected from, e.g., Groups II, III, IV, V, VI, etc., and can include quaternaries and tertiaries, as well as oxides. Different nanostructure types can be assembled by the methods herein, e.g., group III-V semiconductor nanostructures, group II-VI semiconductor nanostructures, group II-IV semiconductor nanostructures, etc. The nanostructures produced in the methods and systems optionally comprise one or more nanowire, nanotube, nanorod, nanotetrapod or nanodot.

The catalyst is typically entrapped in the gas stream, which is optionally converted into a plasma stream, e.g., prior to contacting the nanostructure precursors to the catalysts in the resulting plasma stream. The catalyst is optionally entrapped in a gas stream and converted into a plasma by flowing the gas stream through a radio frequency or microwave field. In general, the gas stream is optionally converted into a plasma stream by any available method, e.g., by exposing the stream to a radio frequency or microwave field of sufficient intensity to produce plasma, before or after the catalyst is entrapped in the stream.

The nanostructure synthesis region optionally comprises a target that comprises the catalyst. In one embodiment, the precursor is entrapped in an additional gas stream that is preheated prior to being exposed to the plasma in a reaction chamber. In another embodiment, the catalyst is optionally entrapped in the gas stream by pulsing a catalyst target with a laser, thereby vaporizing a portion of the catalyst target and releasing catalyst into the gas stream. In one such embodiment, the catalyst is on a movable stage (e.g., a motorized stage) that is moved to provide release of a constant amount of catalyst by the laser. The system comprises a laser that releases the catalyst from the target during operation of the system. The laser optionally comprises a control loop that pulses the laser and other features that improve control of the laser, e.g., a laser energy meter.

The nanostructure precursors are introduced into the flowing stream before, after or during flowing of the catalyst. The nanostructure precursors can optionally be preheated in the flowing gas stream before contacting the catalyst. The precursors optionally contact the catalyst in a reaction chamber in which the catalyst is released from a catalyst target by pulsing the target with a laser.

In one class of embodiments, the extraction comprises condensing the nanostructures on a cold substrate That is, the nanostructure extraction site typically comprises a substrate that is sufficiently cold to condense gas or plasma comprising a nanostructure onto the substrate. Gas or plasma can be extracted downstream of a site where the nanostructures are extracted. The gas or plasma is optionally scrubbed with a scrubber (e.g., a bag and filter system or an electrostatic precipitator) and can be released or re-used.

The flow path optionally includes a gas preheater that preheats the gas prior to flow of the gas to the nanostructure synthesis region. The system can also include an additional gas source and an additional flow path from the additional gas source to the synthesis region, either of which is optionally pre-heated with an optional additional preheater.

In one embodiment, the precursor source is coupled to the additional gas source the system comprises system instructions that direct the precursor to be flowed through the preheater prior to delivery of the precursor to the nanostructure synthesis region. In this embodiment, the gas or plasma source is optionally coupled to the catalyst source and the system optionally comprises system instructions that direct the catalyst to be flowed into the synthesis region.

Gas Phase Continuous Reactor for Nanowire Synthesis

Figure 4:
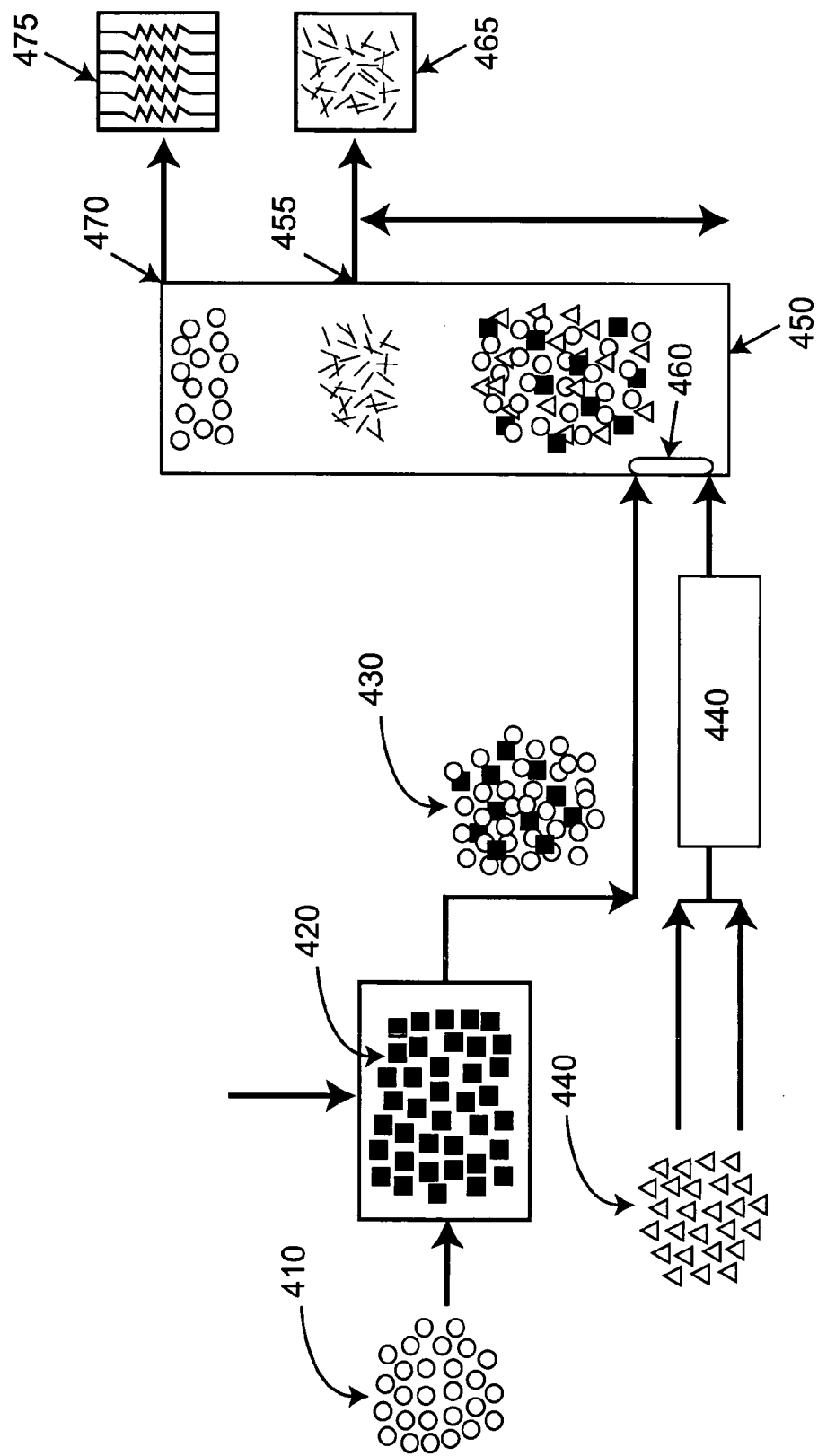
FIG. 4 is a schematic of a continuous reactor for producing nanostructures.

FIG. 4 provides an example continuous phase reactor for nanostructure synthesis. As shown, high purity gas source 410 (e.g., comprising He or another noble gas) is aspirated through colloid solution 420 (e.g., comprising gold or other nanostructure precursors as noted herein) comprising particles of known diameter. This entraps catalyst particles into the gas stream, producing entrapped particles 430. In parallel, gasses comprising precursor materials (e.g., $SiH_4$, $B_2H_6$, etc.) 440 are preheated using gas preheater 450 to approximately the same temperature as entrapped particles 430. Particles 430 and gasses 440 are mixed in reactor 450, e.g., at 400° C. The residence time along a mean free path of gasses 440 mixed with entrapped particles 430 defines the length of the nanostructures (e.g., nanowires) produced. The residence time, in turn, is defined by extraction point 455 which is H above introduction point 460 for particles 430 and gasses 440. The mean free path is defined by reactor pressure, e.g., driven by a secondary gas non-reactive gas such as Ar. The bulk of nanostructures can be extracted at extraction point 455 and collected by condensation on cold surface 465. Any residual gas can be extracted above extraction point 455, at extraction point 470. The gas can then be scrubbed with scrubber 475, e.g., via filters or bags, or with an electrostatic precipitator, e.g., as commonly used in cleaning gaseous emissions.

Plasma Assisted Gas Phase Nanowire Synthesis

Figure 5:
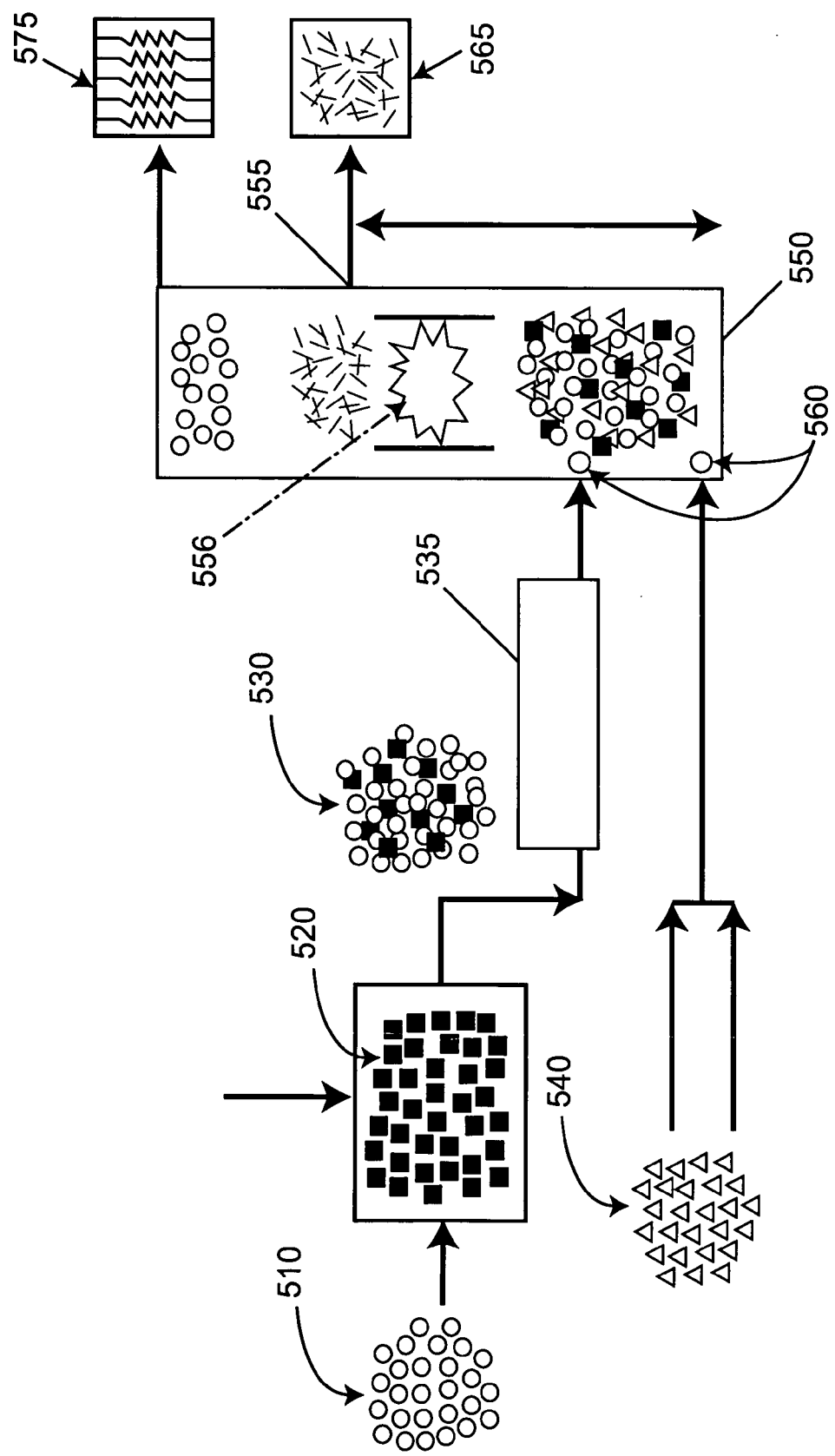
FIG. 5 is a schematic of a continuous reactor for producing nanostructures.

FIG. 5 provides a system similar to FIG. 4, except that particles are run through a radio frequency or microwave field to convert the relevant gas into a plasma. In addition, the use of plasma reduces the need to preheat gasses comprising nanostructure precursors prior to reaction.

As shown, high purity gas source 510 (e.g., comprising He or another noble gas) is aspirated through colloid solution 520 (e.g., comprising gold or other nanostructure precursors as noted herein) comprising particles of known diameter. This entraps catalyst particles into the gas stream, producing entrapped particles 530. The entrapped particles are run through a radio frequency or microwave field in RF plasma cleaner 535 to produce plasma. In parallel, gasses comprising precursor materials (e.g., $SiH_4$, $B_2H_6$, etc.) 540 are flowed to reactor 550 comprising plasma zone 556. Particles 530 and gasses 540 are mixed in reactor 550 in plasma zone 556. The residence time along a mean free path of gasses 540 mixed with entrapped particles 530 defines the length of the nanostructures (e.g., nanowires) produced. The residence time, in turn, is defined by extraction point 555 which is H above introduction point 560 for particles 530 and gasses 540. The mean free path is defined by reactor pressure, e.g., driven by a secondary gas non-reactive gas such as Ar. The bulk of nanostructures can be extracted at extraction point 555 and collected by condensation on cold surface 565. Any residual gas can be extracted above extraction point 555, at extraction point 570. The gas can then be scrubbed with scrubber 575, e.g., via filters or bags, or with an electrostatic precipitator, e.g., as commonly used in cleaning gaseous emissions.

Gas Phase Continuous Reactor for Nanowire Synthesis with Laser and Gold Targets

This example provides a reactor design for making nanowires or other nanostructures in a continuous or semi-continuous mode. The synthesis occurs in a gas phase using a gold catalyst target and a laser energy source.

Figure 6:
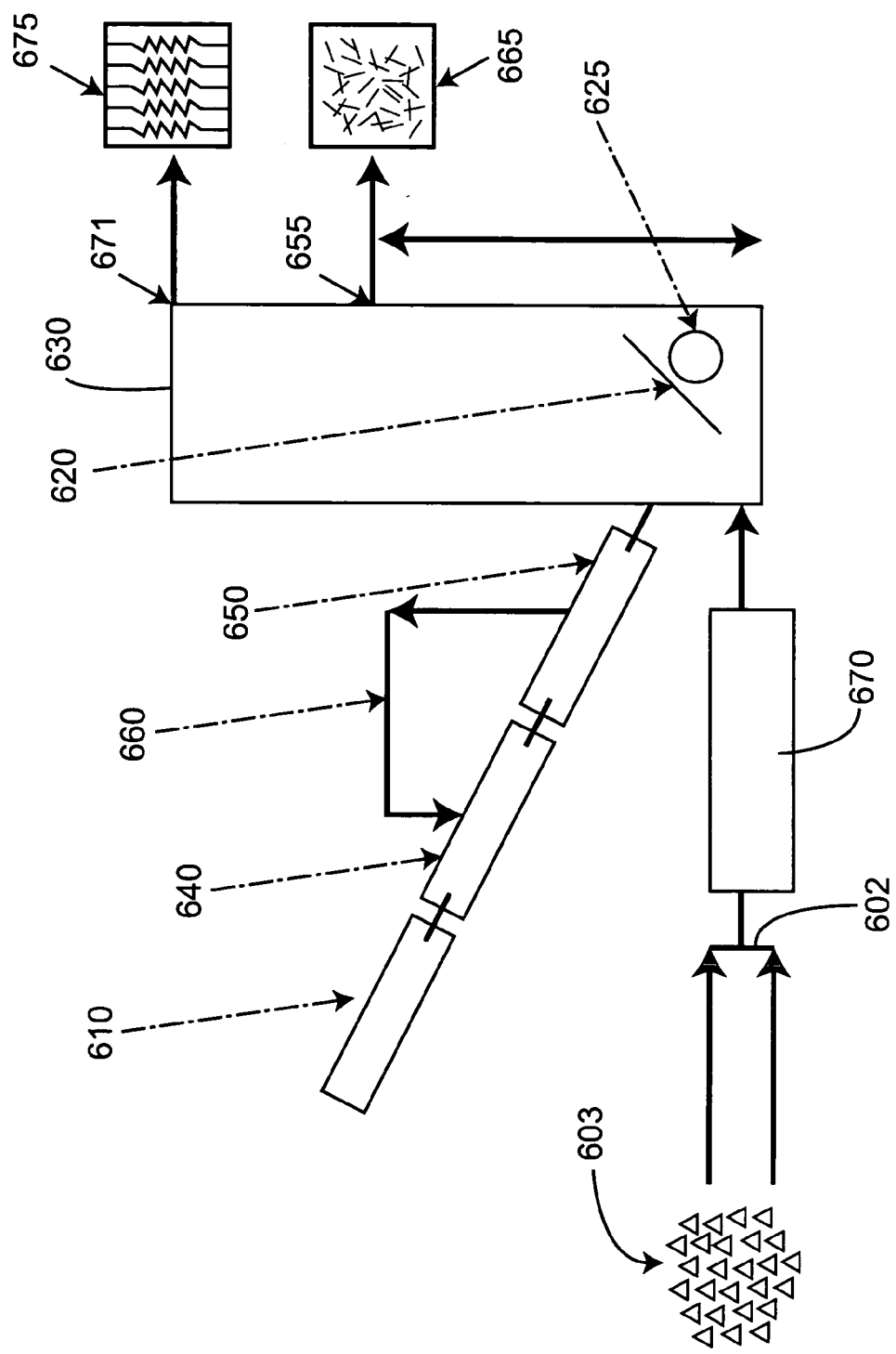
FIG. 6 is a schematic of a continuous reactor for producing nanostructures.

FIG. 6 schematically illustrates one embodiment of the reactor design. As depicted, pulsed laser 610 fires at gold target 620 within reactor 630. Neutral density filter 640 controlled with laser energy meter 650 via control loop 660 controls flux energy to ensure that each shot fired by laser 610 delivers a similar flux energy. The flux energy is delivered to target 620 which is motorized with motor 625 to provide movement of the target, thereby ensuring that the amount of gold released is the same for each shot of laser 610. In parallel at point 602, gasses 603 for the type of wire being fabricated are introduced into gas preheater 670. For example, $SiH_4$ or $B_2H_6$ can be introduced into the preheater, where they are preheated to approximately the same temperature as reactor 630 (e.g., about 400° C.). Gold particles from target 620 (i.e., volatilized into reactor 630 by laser 610) mix with gasses 603 from preheater 670 in reactor 630. Residence time along a mean free path of gasses 603 mixed with the gold particles defines the length of the nanostructures (e.g., nanowires) produced in reactor 630. The mean free path is defined by reactor pressure, e.g., driven by a secondary gas non-reactive gas such as Ar. The bulk of nanostructures can be extracted at extraction point 655 and collected by condensation on cold surface 665. Any residual gas can be extracted above extraction point 655, at extraction point 671. The gas can then be scrubbed with scrubber 675, e.g., via filters or bags, or with an electrostatic precipitator, e.g., as commonly used in cleaning gaseous emissions.

Methods for Treating Nanostructures to Develop a Functional Surface

In a number of applications, it is useful to functionalize the surface of a nanostructure to permit attachment of functional chemical moieties to the nanostructures and/or to insulate the nanostructures. One useful class of functionalizing element comprises nitrogen, e.g., to provide an amine functionality on the nanostructure, for either insulation or chemical attachment of additional components. In the past, this has typically been achieved via silanation or nitridation. In the present invention, a functionalizing plasma is used to functionalize nanostructures. That is, the nanostructures or nanostructure precursors are treated with a plasma that comprises a desirable moiety to include on the surface of the nanostructures.

For example, the present invention provides a new way of making functionalized nanowires, including amine functionalized nanowires. For example, the methods provide a plasma-based method of treating nanostructures or nanostructure precursors to develop an insulating nitride layer that is terminated with primary amines. Plasmas used in the methods and nanostructures produced by the methods are also a feature of the invention.

For example, by treating nanostructures or precursors using ammonia, nitrogen/hydrogen or a primary amine containing precursor, e.g., using plasma initiation, it is possible to exchange or deposit a silicon nitride layer. This layer can be optimized so that the outer layer of the nanostructure is amine terminated. Thus, for sensor or other applications, a ready surface for attachment of ligands via standard chemistries exists, eliminating the need for treatment with organosilanes or similar chemistries. Additionally, the nitride layer provides a high quality insulator.

Accordingly, one aspect of the invention provides methods of making a functionalized nanostructure (or a functionalized nanostructure precursor, which is later used to make a nanostructure of interest). In the methods, the nanostructure or precursor is treated with a functionalizing plasma, whereby a functional group is attached to the precursor or nanostructure. That is, the plasma comprises component elements of the moiety to be used to functionalize the nanostructure or precursor (e.g., amine constituents or other chemical moieties such as silane moieties). For example, the functionalizing plasma can comprise ammonia, nitrogen, a primary amine, hydrogen, or the like.

Most typically, the functional group is attached to the outer surface of the nanostructure. This provides for attachment of additional components through the relevant chemistries, or, e.g., for production of an insulating layer on the nanostructure.

Accordingly, one feature of the invention also provides a plasma comprising a functionalizing precursor (the component in the plasma that is incorporated or partly incorporated into the moiety that is used to functionalize the nanostructure) and a nanostructure precursor or a nanostructure. Similarly, a nanostructure comprising a nitride or other functional layer (e.g., an insulating layer) is also a feature of the invention.

Details regarding plasmas and relevant chemistries can be found, e.g., in Kirk-Othmer *Concise Encyclopedia of Chemical Technology* (1999) Fourth Edition by Grayson et al (ed). John Wiley & Sons, Inc, New York and in Kirk-Othmer *Encyclopedia of Chemical Technology* Fourth Edition (1998 and 2000) by Grayson et al (ed). Wiley Interscience (print edition)/John Wiley & Sons, Inc. (e-format). Further relevant information can be found in *CRC Handbook of Chemistry and Physics* (2003) 83 edition by CRC Press. Details on conductive coatings, which can also be incorporated onto nanostructures by the plasma methods noted above can be found in H. S. Nalwa (ed.), *Handbook of Organic Conductive Molecules and Polymers*, John Wiley & Sons 1997 . See also, ORGANIC SPECIES THAT FACILITATE CHARGE TRANSFER TO/FROM NANOCRYSTALS U.S. Ser. No. 60/452,232 filed Mar. 4, 2003 by Whiteford et al. Details regarding organic chemistry, relevant e.g., for coupling of additional moieties to a functionalized surface can be found, e.g., in Greene (1981) *Protective Groups in Organic Synthesis*, John Wiley and Sons, New York, as well as in Schmidt (1996) *Organic Chemistry* Mosby, St Louis, Mo., and *March's Advanced Organic Chemistry reactions* , mechansims and structure, Fifth Edition (2000) Smith and March, Wiley Interscience New York ISBN 0-471-58589-0.

Additional Details Regarding Nanostructures

Certain of the above embodiments can be used with existing methods of nanostructure fabrication as well as those set forth herein. For example, the various methods of fluidically flowing nanostructures to form arrays of nanostructures (and other manufacturing methods) can be performed using nanostructures made by the foregoing methods or via other known methods. Similarly, nanostructures in general can be functionalized according to the plama-based methods described herein. A variety of methods for making nanostructures and nanostructures resulting from the methods have been described and can be adapted for use in various of the methods, systems and devices of the invention.

The nanowires can be fabricated of essentially any convenient material (e.g., a semiconducting material, a ferroelectric material, a metal, etc.) and can comprise essentially a single material or can be heterostructures.

The nanocrystals employed in the present invention can be fabricated from essentially any convenient material. For example, the nanocrystals can comprise a semiconducting material, for example a material comprising a first element selected from group 2 or from group 12 of the periodic table and a second element selected from group 16 (e.g., ZnS, ZnO, ZnSe, ZnTe, CdS, CdSe, CdTe, HgS, HgSe, HgTe, MgS, MgSe, MgTe, CaS, CaSe, CaTe, SrS, SrSe, SrTe, BaS, BaSe, BaTe, and like materials); a material comprising a first element selected from group 13 and a second element selected from group 15 (e.g., GaN, GaP, GaAs, GaSb, InN, InP, InAs, InSb, and like materials); a material comprising a group 14 element (Ge, Si, and like materials); a material such as PbS, PbSe, PbTe, AlS, AlP, and AlSb; or an alloy or a mixture thereof.

It will be understood by one of skill in the art that the term "silicon oxide" as used herein can be understood to refer to silicon at any level of oxidation. In other words, the term silicon oxide can refer to the chemical structure $SiO_x$, wherein x is between 0 and 2 inclusive.

Common methods for making silicon nanostructures include vapor liquid solid growth (VLS), laser ablation (laser catalytic growth) and thermal evaporation. See, for example, Morales et al. (1998) "A Laser Ablation Method for the Synthesis of Crystalline Semiconductor Nanowires" *Science* 279, 208–211 (1998). In one example approach, a hybrid pulsed laser ablation/chemical vapor deposition (PLA-CVD) process for the synthesis of semiconductor nanowires with longitudinally ordered heterostructures is used. See, Wu et al. (2002) "Block-by-Block Growth of Single-Crystalline Si/SiGe Superlattice Nanowires," *Nano Letters* Vol 0, No. 0.

In general, several methods of making nanostructures and other resulting nanostructures have been described and can be applied in the methods, systems and devices herein. In addition to Morales et al. and Wu et al. (above), See, for example, Lieber et al. (2001) "Carbide Nanomaterials" U.S. Pat. No. 6,190,634 B1; Lieber et al. (2000) "Nanometer Scale Microscopy Probes U.S. Pat. No. 6,159,742; Lieber et al. (2000) "Method of Producing Metal Oxide Nanorods" U.S. Pat. No. 6,036,774; Lieber et al. (1999) "Metal Oxide Nanorods" U.S. Pat. No. 5,897,945; Lieber et al. (1999) "Preparation of Carbide Nanorods" U.S. Pat. No. 5,997,832; Lieber et al. (1998) "Covalent Carbon Nitride Material Comprising $C_2N$ and Formation Method; Thess, et al. (1996) "Crystalline Ropes of Metallic Carbon Nanotubes" *Science* 273, 483–486; Lieber et al. (1993) "Method of Making a Superconducting Fullerene Composition By Reacting a Fullerene with an Alloy Containing Alkali Metal U.S. Pat. No. 5,196,396, and Lieber et al. (1993) Machining Oxide Thin Films with an Atomic Force Microscope: Pattern and Object Formation on the Nanometer Scale" U.S. Pat. No. 5,252,835. Recently, one dimensional semiconductor heterostructure nanocrystals which can be arranged/positioned/oriented, etc., according to the present invention, have been described. See, e.g., Bjork et al. (2002) "One-dimensional Steeplechase for Electrons Realized" *Nano Letters* Vol 0, No. 0.

In another approach, synthetic procedures to prepare individual nanowires on surfaces and in bulk are described, for example, by Kong, et al. (1998) "Synthesis of Individual Single-Walled Carbon Nanotubes on Patterned Silicon Wafers," *Nature* 395, 878–881, and Kong, et al. (1998), "Chemical Vapor Deposition of Methane for Single-Walled Carbon Nanotubes" *Chem. Phys. Lett.* 292, 567–574.

In yet another approach, substrates and self assembling monolayer (SAM) forming materials can be used, e.g., along with microcontact printing techniques to make nanostructures, such as those described by Sch-n, Meng, and Bao, "Self-assembled monolayer organic field-effect transistors," *Nature* 413:713 (2001); Zhou et al. (1997) "Nanoscale Metal/Self-Assembled Monolayer/Metal Heterostructures," *Applied Physics Letters* 71:611; and WO 96/29629 (Whitesides, et al., published Jun. 26, 1996).

Synthesis of nanocrystals of various composition is described in, e.g., Peng et al. (2000) "Shape control of CdSe nanocrystals" *Nature* 404:59–61; Puntes et al. (2001) "Colloidal nanocrystal shape and size control: The case of cobalt" *Science* 291:2115–2117; U.S. Pat. No. 6,306,736 to Alivisatos et al. (Oct. 23, 2001) entitled "Process for forming shaped group III-V semiconductor nanocrystals, and product formed using process"; U.S. Pat. No. 6,225,198 to Alivisatos et al. (May 1, 2001) entitled "Process for forming shaped group II-VI semiconductor nanocrystals, and product formed using process"; U.S. Pat. No. 5,505,928 to Alivisatos et al. (Apr. 9, 1996) entitled "Preparation of III-V semiconductor nanocrystals"; U.S. Pat. No. 5,751,018 to Alivisatos et al. (May 12, 1998) entitled "Semiconductor nanocrystals covalently bound to solid inorganic surfaces using self-assembled monolayers"; U.S. Pat. No. 6,048,616 to Gallagher et al. (Apr. 11, 2000) entitled "Encapsulated quantum sized doped semiconductor particles and method of manufacturing same"; and U.S. Pat. No. 5,990,479 to Weiss et al. (Nov. 23, 1999) entitled "Organo luminescent semiconductor nanocrystal probes for biological applications and process for making and using such probes."

Growth of nanostructures such as nanowires having various aspect ratios, including nanowires with controlled diameters, is described in, e.g., Gudiksen et al (2000) "Diameter-selective synthesis of semiconductor nanowires" *J. Am. Chem. Soc.* 122:8801–8802; Cui et al. (2001) "Diameter-controlled synthesis of single-crystal silicon nanowires" *Appl. Phys. Lett.* 78: 2214–2216; Gudiksen et al. (2001) "Synthetic control of the diameter and length of single crystal semiconductor nanowires" *J. Phys. Chem. B* 105: 4062–4064; Morales et al. (1998) "A laser ablation method for the synthesis of crystalline semiconductor nanowires" *Science* 279:208–211; Duan et al. (2000) "General synthesis of compound semiconductor nanowires" *Adv. Mater.* 12:298–302; Cui et al. (2000) "Doping and electrical transport in silicon nanowires" *J. Phys. Chem. B* 104:5213–5216; Peng et al. (2000), supra; Puntes et al. (2001), supra; U.S. Pat. No. 6,225,198 to Alivisatos et al., supra; U.S. Pat. No. 6,036,774 to Lieber et al. (Mar. 14, 2000) entitled "Method of producing metal oxide nanorods"; U.S. Pat. No. 5,897,945 to Lieber et al. (Apr. 27, 1999) entitled "Metal oxide nanorods"; U.S. Pat. No. 5,997,832 to Lieber et al. (Dec. 7, 1999) "Preparation of carbide nanorods"; Urbau et al. (2002) "Synthesis of single-crystalline perovskite nanowires composed of barium titanate and strontium titanate" *J. Am. Chem. Soc.*, 124, 1186; Yun et al. (2002) "Ferroelectric Properties of Individual Barium Titanate Nanowires Investigated by Scanned Probe Microscopy" *Nano Letters* 2, 447; and published PCT application nos. WO 02/17362, and WO 02/080280.

Growth of branched nanowires (e.g., nanotetrapods, tripods, bipods, and branched tetrapods) is described in, e.g., Jun et al. (2001) "Controlled synthesis of multi-armed CdS nanorod architectures using monosurfactant system" *J. Am. Chem. Soc.* 123:5150–5151; and Manna et al. (2000) "Synthesis of Soluble and Processable Rod-, Arrow-, Teardrop-, and Tetrapod-Shaped CdSe Nanocrystals" *J. Am. Chem. Soc.* 122:12700–12706. Synthesis of nanoparticles is described in, e.g., U.S. Pat. No. 5,690,807 to Clark Jr. et al. (Nov. 25, 1997) entitled "Method for producing semiconductor particles"; U.S. Pat. No. 6,136,156 to El-Shall, et al. (Oct. 24, 2000) entitled "Nanoparticles of silicon oxide alloys"; U.S. Pat. No. 6,413,489 to Ying et al. (Jul. 2, 2002) entitled "Synthesis of nanometer-sized particles by reverse micelle mediated techniques"; and Liu et al. (2001) "Sol-Gel Synthesis of Free-Standing Ferroelectric Lead Zirconate Titanate Nanoparticles" *J. Am. Chem. Soc.* 123:4344. Synthesis of nanoparticles is also described in the above citations for growth of nanocrystals, nanowires, and branched nanowires.

Synthesis of core-shell nanostructure heterostructures are described in, e.g., Peng et al. (1997) "Epitaxial growth of highly luminescent CdSe/CdS core/shell nanocrystals with photostability and electronic accessibility" *J. Am. Chem. Soc.* 119:7019–7029; Dabbousi et al. (1997) "(CdSe)ZnS core-shell quantum dots: Synthesis and characterization of a size series of highly luminescent nanocrystallites" *J. Phys. Chem. B* 101:9463–9475; Manna et al. (2002) "Epitaxial growth and photochemical annealing of graded CdS/ZnS shells on colloidal CdSe nanorods" *J. Am. Chem. Soc.* 124:7136–7145; and Cao et al. (2000) "Growth and properties of semiconductor core/shell nanocrystals with InAs cores" *J. Am. Chem. Soc.* 122:9692–9702. Similar approaches can be applied to growth of other core-shell nanostructures. See, for example, U.S. Pat. No. 6,207,229 (Mar. 27, 2001) and U.S. Pat. No. 6,322,901 (Nov. 27, 2001) to Bawendi et al. entitled "Highly luminescent color-selective materials".

Growth of homogeneous populations of nanowires, including nanowire heterostructures in which the different materials are distributed at different locations along the long axis of the nanowire is described in, e.g., published PCT application nos. WO 02/17362, and WO 02/080280; Gudiksen et al. (2002) "Growth of nanowire superlattice structures for nanoscale photonics and electronics" *Nature* 415:617–620; Bjork et al. (2002) "One-dimensional steeplechase for electrons realized" *Nano Letters* 2:86–90; Wu et al. (2002) "Block-by-block growth of single-crystalline Si/SiGe superlattice nanowires" *Nano Letters* 2, 83–86; and U.S. patent application Ser. No. 60/370,095 (Apr. 2, 2002) to Empedocles entitled "Nanowire heterostructures for encoding information." Similar approaches can be applied to growth of other heterostructures and applied to the various methods and systems herein.

In addition to manipulating or modifying nanostructures, the present invention can be used to manipulate structures that may fall outside of the size range of nanostructures. For example, Haraguchi et al. (U.S. Pat. No. 5,332,910) propose devices that comprise nanowhiskers. Semi-conductor whiskers are also described by Haraguchi et al. (1994) "Polarization Dependence of Light Emitted from GaAs p-n junctions in quantum wire crystals" *J. Appl. Phys.* 75(8): 4220–4225; Hiruma et al. (1993) "GaAs Free Standing Quantum Sized Wires," *J. Appl. Phys.* 74(5):3162–3171; Haraguchi et al. (1996) "Self Organized Fabrication of Planar GaAs Nanowhisker Arrays, and Yazawa (1993) "Semiconductor Nanowhiskers" *Adv. Mater.* 5(78):577–579.

Various device subcomponents such as memory, logic, switches, and the like, utilizing nanostructures or other small scale structures have been described and can be adapted to the present invention, e.g., by using the nanostructures and arrays of nanostructures of the present invention to construct like devices. See, e.g., Huang et al. (2001) "Logic Gates and Computation from Assembled Nanowire Building Blocks," *Science* 294:1313; Huang et al. Huang et al. (2001) "Directed Assembly of One-Dimensional Nanostructures Into Functional Networks," *Science* 291, 630 (2001); Chung et al. (2000) "Si Nanowire Devices," *Appl. Phys. Lett.* 76, 2068); Bachtold et al. (2001) "Logic Circuits with Carbon Nanotube Transistors," *Science* 294:1317; Schon et al. (2001) "Field-Effect Modulation of the Conductance of Single Molecules," *Science* 294:2138; Derycke et al. (August 2001) "Carbon Nanotube Inter- and Intramolecular Logic Gates," *Nano Letters* published on line; Kuekes et al. (2000) "Molecular Wire Crossbar Memory" U.S. Pat. No. 6,128,214; Collier et al. (1999) "Electronically Configurable Molecular-Based Logic Gates" *Science* 285:391–394; Chen et al. (1999) "Observation of a Large On-Off Ratio and Negative Differential Resistance in an Electronic Molecular Switch," *Science* 286:1550. Gallagher et al. (1997) "Magnetic Memory Array Using Magnetic Tunnel Junction Devices in the Memory Cells" U.S. Pat. No. 5,640,343, Glen et al. (1993) "Large Capacity Solid State Memory" U.S. Pat. No. 5,274,602; Service (2001), "Assembling Nanocircuits From the Bottom Up," *Science* 293, 782 ; and Tseng and Ellenbogen, (2001) "Toward Nanocomputers," *Science* 294, 1293. Nanostructures or nanostructure arrays made according to the present invention optionally can similarly be configured as memory, logic, computing elements, or the like.

Devices such as Biosensors Comprising Nanostructures

As noted previously, structures for use in the present invention include, but are not limited to, various nanostructures and methods of making or modifying such nanostructures. In general, nanostructures, such as nanocrystals, nanowires, nanorods, nanotetrapods, nanoparticles and the like, can be fabricated by any of a number of mechanisms known to one of skill in the art, as well as those described herein. Where the methods and systems of the invention utilize nanostructures, the methods of the present invention, and/or those that are otherwise available, can be used in the context of the present invention, e.g., for incorporation into the methods or systems described above.

One aspect of the present invention is that the various methods herein can be used to make nanostructures, or to assemble nanostructures into functional elements or devices such as biosensors. Thus, available methods of making functional nanostructure elements can be applied to the present invention. For example, nanowire based devices, arrays and methods of manufacture have recently been described. See e.g., Lieber et al. (2001) "Nanoscopic Wire-Based Devices, Arrays, and Methods of their Manufacture" WO 01/03208 A1.

In addition to the references noted above, other one-dimensional functional networks of nanostructures have been described. see, Huang et al. (2001) "Directed Assembly of One-Dimensional Nanostructures into Functional Networks," Science 291:630–633. Similarly, semiconducting carbon nanotubes have been shown to function as electrically-based sensors of gas molecules. See, e.g., J. Kong et al., (2000) "Nanotube Molecular Wires as Chemical Sensors" Science 287, 662–625. In addition, planar silicon structures have been used to make electrically and photoelectrically based sensors. A small-scale pH sensor has been described that operates on standard 'field effect' principle. See, Manalis et al., (2000) "Microvolume Field-Effect pH Sensor for the Scanning Probe Microscope" Applied Phys. Lett. 76, 1072–1074.

In sensor applications in general, chemical changes associated with nanostructures used or made in the invention can modulate the properties of the wires (conductivity, mass, etc.) to detect analytes of interest. This property can be used in any of a variety of device contexts, e.g., where the nanostructures are formed into biosensor devices.

For example, if desired, the nanoscopic wires can be coated with a specific coating of interest (e.g., a ligand such as a peptide or protein, e.g., an enzyme), chosen for its ability to bind a particular ligand binding partner (e.g., an antibody or receptor can bind a ligand, or can themselves be the ligand to which ligand binding partner binds). Common analytes of interest for which detection is sought include glucose, cholesterol, warfarin, anthrax, testosterone, erythromycin, metabolites, pesticides, toxic molecules (e.g., formaldehyde, benzene, toluene, plutonium, etc.), ethanol (or other alcohols), pyruvate, and/or drugs.

For example, biosensors can include nanostructures which capture or comprise enzymes such as oxidases, reductases, aldehyde/ketone reductases, alcohol dehidrogenases, aldehyde oxidases, cytochrome p450s, flavin monooxygenases, monoamine oxidases, xanthine oxidases, ester/amide hydrolases, epoxide hydrolases or their substrates or which capture their reaction products. Signal transduction is optionally facilitated by use of conductive polymers, to bind compounds to the nanostructure, which facilitates electron transport to the surface of the structure. Several such polymers are available, including, e.g., polyaniline. It will be recognized that many of the biomolecules or other analytes to be captured (proteins, nucleic acids, lipids, carbohydrates) in the setting of a biosensor are charged, which can be used to cause them to "switch" a nanoscale transistor, providing for detection of binding of an analyte.

In other embodiments, biomolecules such as enzymes generate signals that are detected by an array. For example, the array can include a glucose oxidase and/or a cholesterol oxidase enzyme for the detection of glucose or cholesterol levels in blood or other biological fluids. For example, a number of existing glucose monitoring systems exist, including ferrocene, ferricyanide and Osmium polymer mediated systems. These systems generally use glucose oxidases in the process of glucose detection. These systems are adapted to the present invention by mounting or capturing one or more analyte detection molecule (e.g., glucose oxidase or the relevant mediator) on a nanostructure of interest. Similarly, in a biohazard detector, a p450 or other suitable enzyme can be used to detect the presence of warfarin or another relevant molecule of interest.

Thus, the present invention provides a portable (optionally even a "hand-held") biosensor device for home, field, or hospital use. The device includes a nanostructure coupled to an appropriate biological detection system as noted above, and optionally further includes auxilary components such as cofactors, buffers, or other reagents. To perform an assay, the nanowire array is placed in, e.g., a handheld device equipped with electrodes positioned to interface with the array. A sample is added to the array, and the sample is incubated with the array, permitting formation of a signal, e.g., conversion of a substrate to a detectable product, oxidation or reduction of a mediator, emission of an optical signal, etc. A variety of signal detection methods are employed in the context of the nanowire arrays, e.g., utilizing spectrophotometry, surface plasmon resonance (SPR), fluorescence polarization (FP), fluorescent wavelength shift, fluorescence quenching, colorimetric quenching, fluorescence resonance energy transfer (FRET), liquid crystal displays (LCD), and the like. The result of analyte binding is provided as a readout of the device, e.g., on an LCD.

In any of the above embodiments, an assay result can be measured by determining the presence and/or quantitiy of an assay product by the methods described, or by determining the presence and/or quantity of a secondary product of the assay product. This could be an enzymatic product produced by the presence of the assay product, a PCR product of the assay product, a fragment of the assay product, a label bound to the assay product, a product of an enzyme bound to the assay product, or any other product that is present in a calibratable quantity relative to the quantity of the assay product.

In some embodiments of the present invention, the nanostructures comprise a shell or sheath. A shell or sheath is a coating on at least a portion of the nanostructure that is substantially uniformly distributed on the outside of the nanostructure across at least one portion of the nanostructure. This can be either a complete shell, in which the entire surface of the nanostructure is coated, or can be a partial shell, in which only a portion of the nanostructure is coated.

It will be understood by one of skill in the art that the term "silicon oxide" as used herein is optionally understood to refer to silicon at any level of oxidation. In other words, the term silicon oxide can refer to the chemical structure $SiO_x$, wherein x is between 0 and 2 inclusive.

While the foregoing invention has been described in some detail for purposes of clarity and understanding, it will be clear to one skilled in the art from a reading of this disclosure that various changes in form and detail can be made without departing from the true scope of the invention. For example, all the techniques and apparatus described above can be used in various combinations. All publications, patents, patent applications, and/or other documents cited in this application are incorporated by reference in their entirety for all purposes to the same extent as if each individual publication, patent, patent application, and/or other document were individually indicated to be incorporated by reference for all purposes.

What is claimed is:

1. A method of harvesting a nanostructure from a substrate, the nanostructure comprising at least a first region comprising a first material and a second region comprising a second material, wherein the first material is differentially etchable from the second material, the method comprising etching away the first material of the nanostructure to release the nanostructure from the substrate at the first region.

2. The method of claim 1, wherein the nanostructure comprises a heterostructure nanostructure.

3. The method of claim 1, wherein the nanostructure comprises a nanowire, nanotube, nanorod, or nanoribbon.

4. The method of claim 1, wherein the first region comprises a sheath.

5. The method of claim 1, wherein the first material comprises silicon oxide.

6. The method of claim 1, wherein the method comprises etching a set of etchable portions, thereby releasing a set of nanostructures.

7. The method of claim 1, wherein the first material of the nanostructure is etched with one or more etchant.

8. The method of claim 7, wherein the etchant comprises one or more of: a dry etchant, a wet-etchant, an isotropic etchant, an anisotropic etchant and a selective etchant.

9. The method of claim 1, wherein the nanostructure is attached to the substrate at the first region of the nanostructure.

10. The method of claim 1, wherein the first region and second region are adjacent to one another along the length of the nanostructure.

11. A method of harvesting a nanostructure from a substrate, the nanostructure comprising at least a first region comprising a first material and a second region comprising a second material, wherein the first material comprises a dopant that is differentially etchable from the second material, the method comprising etching away the first material of the nanostructure to release the nanostructure from the substrate at the first region.

12. A method of harvesting a nanostructure from a substrate, the nanostructure comprising at least a first region comprising a first material and a second region comprising a second material, wherein the first region and second region are not adjacent to one another along the length of the nanostructure and the first material is differentially etchable from the second material, the method comprising etching away the first material of the nanostructure to release the nanostructure from the substrate at the first region.

13. A method of harvesting a nanostructure from a substrate, the nanostructure comprising at least a first region comprising a first material and a second region comprising a second material, wherein the first material comprises silicon and the second material comprises germanium and the first material is differentially etchable from the second material, the method comprising etching away the first material of the nanostructure to release the nanostructure from the substrate at the first region.

14. A method of harvesting a nanostructure from a substrate, the nanostructure comprising at least a first region comprising a first material and a second region comprising a second material, wherein the second region comprises a P-N junction and the first material is differentially etchable from the second material, the method comprising etching away the first material of the nanostructure to release the nanostructure from the substrate at the first region.

15. A method of harvesting a nanostructure from a substrate, the nanostructure comprising at least a first region comprising a first material and a second region comprising a second material, wherein the nanostructure is attached to the substrate at a first end of the nanostructure and the first region of the nanostructure is located along the length of the nanostructure at a location which is not immediately adjacent to the first end of the nanostructure and the first material is differentially etchable from the second material, the method comprising etching away the first material of the nanostructure to release the nanostructure from the substrate at the first region.

* * * * *